US011003532B2

(12) United States Patent
Huang et al.

(10) Patent No.: US 11,003,532 B2
(45) Date of Patent: May 11, 2021

(54) DISTRIBUTED DATA OBJECT MANAGEMENT SYSTEM OPERATIONS

(71) Applicant: MICROSOFT TECHNOLOGY LICENSING, LLC, Redmond, WA (US)

(72) Inventors: Cheng Huang, Redmond, WA (US); Jin Li, Bellevue, WA (US); Aaron William Ogus, Woodinville, WA (US); Douglas W. Phillips, Woodinville, WA (US); Yu Lin Chen, New York, NY (US); Shuai Mu, New York, NY (US); Jinyang Li, New York, NY (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 290 days.

(21) Appl. No.: 15/626,073

(22) Filed: Jun. 16, 2017

(65) Prior Publication Data

US 2018/0365104 A1    Dec. 20, 2018

(51) Int. Cl.
  *G06F 11/10*    (2006.01)
  *H03M 13/15*    (2006.01)
  *H03M 13/37*    (2006.01)

(52) U.S. Cl.
  CPC ....... *G06F 11/1076* (2013.01); *H03M 13/154* (2013.01); *H03M 13/373* (2013.01); *H03M 13/3761* (2013.01); *H03M 13/1515* (2013.01)

(58) Field of Classification Search
  None
  See application file for complete search history.

(56) References Cited

U.S. PATENT DOCUMENTS

| | | |
|---|---|---|
| 8,458,287 B2 | 6/2013 | Ozzie et al. |
| 8,819,261 B2 | 8/2014 | Zuckerman et al. |
| 9,141,679 B2 | 9/2015 | Gopalan et al. |
| 9,148,174 B2 | 9/2015 | Baker et al. |
| 9,218,244 B1 | 12/2015 | Hayes et al. |
| 9,281,845 B1 | 3/2016 | Lazier |
| 9,378,084 B2 | 6/2016 | Calder et al. |

(Continued)

OTHER PUBLICATIONS

Mu, et al., "When Paxos Meets Erasure Code: Reduce Network and Storage Cost in State Machine Replication", In Proceedings of the 23rd international symposium on High-performance parallel and distributed computing, Jun. 23, 2014, pp. 61-72.

(Continued)

*Primary Examiner* — Kris E Mackes
*Assistant Examiner* — Soheila (Gina) Davanlou
(74) *Attorney, Agent, or Firm* — Shook, Hardy & Bacon L.L.P.

(57) ABSTRACT

In various embodiments, methods and systems for implementing distributed data object management are provided. The distributed data object management system includes a local metadata-consensus information store and one or more remote metadata-consensus information stores for metadata-consensus information and a local data store and one or more remote data stores for erasure coded fragments. For a write operation, corresponding metadata writes and data writes are performed in parallel using a metadata write path and a data write path, respectively, when writing to the local metadata-consensus information store and the one or more remote metadata-consensus information stores and the local data store and the one or more remote data stores. And, for a read operation, corresponding metadata reads and data reads are performed in parallel using a metadata read path and a data read path, respectively, when reading from the metadata-consensus information stores and the data stores.

20 Claims, 14 Drawing Sheets

(56) References Cited

U.S. PATENT DOCUMENTS

| | | | |
|---|---|---|---|
| 2008/0313364 A1* | 12/2008 | Flynn | G06F 3/0643 710/31 |
| 2013/0151884 A1* | 6/2013 | Hsu | G06F 16/1827 714/4.11 |
| 2013/0290361 A1 | 10/2013 | Anderson et al. | |
| 2014/0236886 A1* | 8/2014 | Gallardo | G06F 16/21 707/609 |
| 2015/0026128 A1* | 1/2015 | Drobychev | G06F 16/23 707/634 |
| 2015/0032691 A1* | 1/2015 | Hall | H04L 29/06 707/610 |
| 2015/0370825 A1* | 12/2015 | Outcalt | G06F 16/178 707/608 |
| 2016/0063008 A1* | 3/2016 | Benight | G06F 16/164 707/694 |
| 2017/0242732 A1* | 8/2017 | Vairavanathan | G06F 9/5038 |
| 2018/0024877 A1* | 1/2018 | Gold | G11C 11/5628 714/773 |
| 2018/0143990 A1* | 5/2018 | Figueroa | G06F 11/1464 |

OTHER PUBLICATIONS

Ma, et al., "An Ensemble of Replication and Erasure Codes for Cloud File Systems", In Proceedings of IEEE, Apr. 14, 2013, 9 pages.

Dobre, et al., "Hybris: Robust Hybrid Cloud Storage", In Proceedings of the ACM Symposium on Cloud Computing, Nov. 3, 2014, 14 pages.

* cited by examiner

| | Geo-Replication | Distributed Data Object Management System (standard durability) - single DC down - OK | | | | Distributed Data Object Management System (ultra durability) - 2 DCs down - OK | |
|---|---|---|---|---|---|---|---|
| # of DCs | 2 | 3 | 4 | 5 | 6 | 5 | 6 |
| Scheme (k + r) | 1 + 1 | 2 + 1 | 3 + 1 | 4 + 1 | 5 + 1 | 3 + 2 | 4 + 2 |
| DC choices | fixed | arbitrary (within region, across region, country, continent, globe) | | | | | |
| Storage Cost | 2.6x | 1.9x | 1.7x | 1.6x | 1.5x | 2.1x | 1.9x |
| Storage Cost Reduction | - | 27% | 35% | 38% | 42% | 19% | 27% |
| Cross-DC Traffic (Put) | 1x | 1x | 1x | 1x | 1x | 1.33x | 1.25x |
| Cross-DC Traffic (Get) | 0 | 0.5x | 0.67x | 0.75x | 0.8x | 0.67x | 0.75x |
| Cross-DC Traffic (Rebuild) | 1x | 2x | 3x | 4x | 5x | 3x | 4x |

FIG. 3

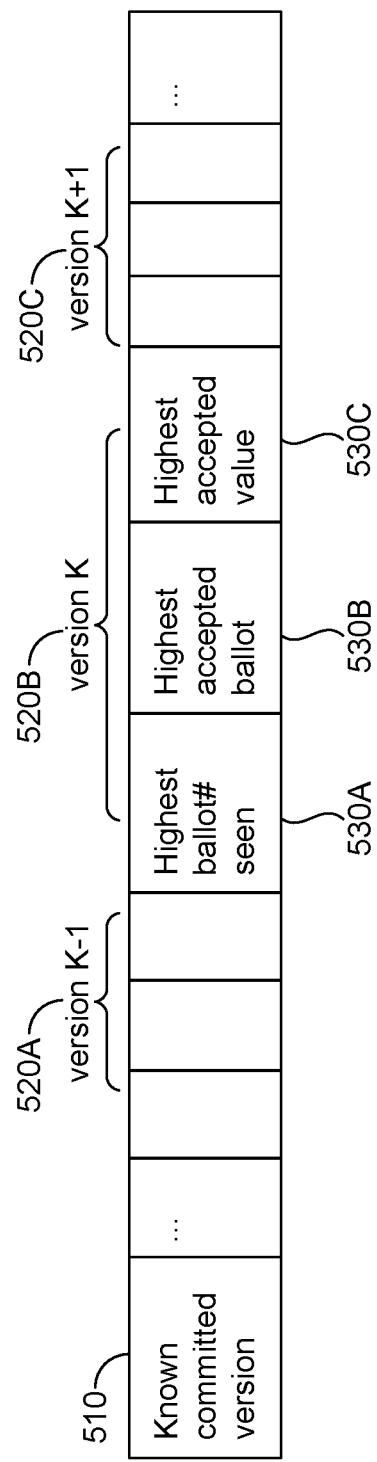

DISTRIBUTED DATA OBJECT MANAGEMENT SYSTEM OPERATIONS

BACKGROUND

Distributed computing systems or cloud computing platforms are computing architectures that support network access to a shared pool of configurable computing and storage resources. A distributed computing system can support building, deploying and managing application and services. An increasing number of users and enterprises are moving away from traditional computing architectures to run their applications and services on distributed computing systems. As such, distributed computing systems are faced with the challenge of supporting the increasing number of users and enterprises sharing the same cloud computing resources. Currently, technological advancements in wide area networking are providing innovations that support reduced cross-datacenter ("cross-DC") bandwidth costs. Distributed computing systems can take advantage of the reduction in cross-DC network traffic cost to provide components that support scalability while maintaining high availability and strong consistent storage services. Distributed computing systems can also aim to efficiently operate when storing workloads with large storage space consumption, relatively cold data with rare concurrent updates. In this regard, storage usage can be optimized based on a data object management system that provides ways for storing and retrieving data objects across global data centers. Data objects can specifically be erasure coded fragments, such that, the data object can be recovered from a subset of the erasure coded fragments of the data object. Several different considerations also have to be made around storage overhead, bandwidth cost and durability. As such, a comprehensive data object management system can be implemented for improved and customizable configurations for data object management in distributed computing systems.

SUMMARY

Embodiments described herein are directed to methods, systems, and computer storage media for distributed data object management in distributed computing systems. A distributed data object management system supports storing and retrieving data objects across global data centers to maximize utilization of computing resources in a distributed computing system. In particular, the distributed data object management system implements a strongly consistent, versioned object store that encodes objects across global data centers.

The distributed data object management system implements consensus protocols (e.g., Paxos and Fast Paxos) contextually (i.e., based on the particular set of circumstances, as described herein in more detail) to achieve consistency. The distributed data object management system is optimized based on metadata paths and data paths for write operations and read operations to support faster execution of operations for target workloads, resulting in lower latency than conventional data object management systems. In one embodiment, the distributed data object management system is built on top of an existing distributed computing storage (i.e., cloud storage system).

In operation, the distributed data object management system includes a distributed storage system having a local metadata-consensus information store and one or more remote metadata-consensus information stores. A metadata-consensus information store is configured to store metadata-consensus information. The metadata-consensus information corresponds to erasure coded fragments of a data object and instruct on how to manage the erasure coded fragment. The distributed storage system further includes a local data store and one or more remote data stores. A data store is configured to store the erasure coded fragments of the data object. The local data store and the one or more remote data stores store the erasure coded fragments of the data object that correspond to metadata-consensus information in the local metadata-consensus information store and the one or more remote metadata-consensus information stores.

The distributed data object management system includes a distributed data object manager for performing distributed data object management operations including, interface operations, configuration operations, write operations, read operations, delete operations, garbage collection operations and failure recovery operations.

With reference to a write operation, corresponding metadata writes and data writes for the write operation are performed in parallel using a metadata write path and a data write path, respectively, when writing to the local metadata-consensus information store and the one or more remote metadata-consensus information stores and the local data store and the one or more remote data stores.

And, with reference to a read operation, corresponding metadata reads and data reads for the read operation are performed in parallel using a metadata read path and a data read path, respectively, when reading from the local metadata-consensus information store and the one or more remote metadata-consensus information stores and the local data store and the one or more remote data stores.

This summary is provided to introduce a selection of concepts in a simplified form that are further described below in the detailed description. This summary is not intended to identify key features or essential features of the claimed subject matter, nor is it intended to be used in isolation as an aid in determining the scope of the claimed subject matter.

BRIEF DESCRIPTION OF THE DRAWINGS

The present invention is described in detail below with reference to the attached drawing figures, wherein:

FIG. 3 illustrates storage, bandwidth and durability trade-offs for a distributed data object management system, in accordance with embodiments described herein;

FIG. 5 illustrates an exemplary metadata table row for a distributed data object management system, in accordance with embodiments described herein;

DETAILED DESCRIPTION

Figure 1:
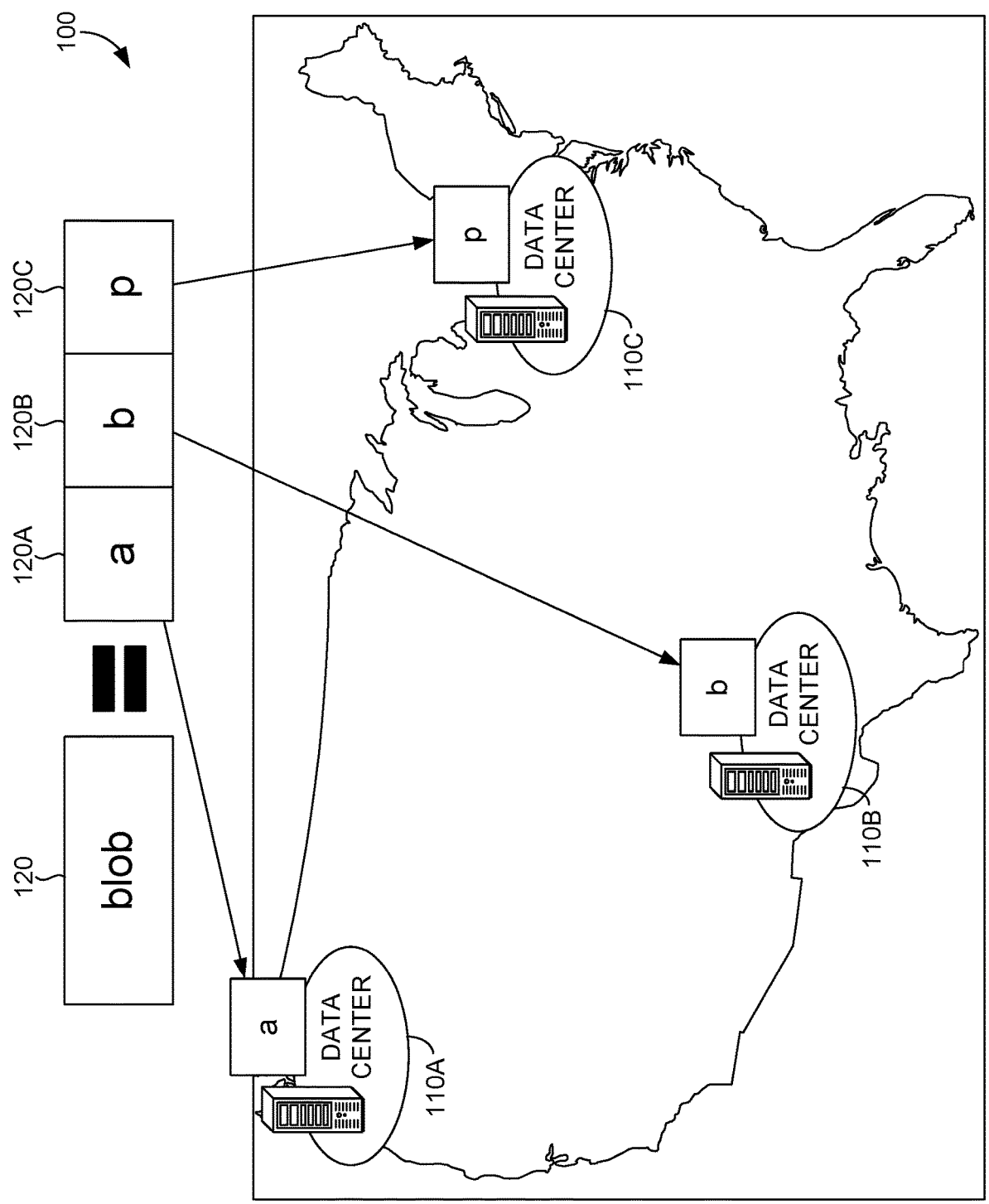
FIG. 1 is a block diagram of an exemplary distributed data object management system, in accordance with embodiments described herein.

Conventional distributed computing systems can implement different techniques (e.g., geo-replication, erasure coding). In particular, erasure coding techniques may be employed to reduce storage overhead. Erasure coding may be implemented across storage nodes (e.g., disk, servers and rack). Erasure coding can provide efficient recovery of missing data (e.g., data fragments) based on protection groups that define dependencies between encoded data fragments. Erasure coding across data centers can be cost prohibitive due to cross-DC network traffic in storing and retrieving data fragments. In particular, total cost of storing customer data includes both the storage and the cross-DC network traffic and cross-DC erasure coding.

Technological advancements in wide area networking are providing innovations that support reduced cross-datacenter ("cross-DC") bandwidth costs for the increasing number of data centers being built all over the globe. Distributed computing systems can take advantage of the reduction in cross-DC network traffic cost to provide components in these data centers that support scalability while maintaining high availability and strong consistent storage services. In this regard, storage usage can be optimized based on a distributed data object management system that provides ways for storing and retrieving data objects across global data centers. The data object management system can also aim to efficiently operate when storing workloads with large storage space consumption, relatively cold data with rare concurrent updates. Data objects can specifically be erasure coded fragments, such that, the data object can be recovered from a subset of the erasure coded fragments of the data object. Several different considerations also have to be made around storage overhead, bandwidth cost and durability. As such, a comprehensive data object management system can be implemented for improved and customizable configurations for data object management in distributed computing systems.

Embodiments of the present invention provide simple and efficient methods and systems for providing distributed data object management. A distributed data object management system supports storing and retrieving data objects across global data centers to maximize utilization of computing resources in a distributed computing system. The distributed data management system can support table stores (e.g., a non-relational, key-value pair storage system suitable for storing massive amounts of unstructured data) and objects store (e.g., a storage system that stores unstructured data as objects or blobs). In particular, the distributed data object management system implements a strongly consistent, versioned object store that encodes objects across global data centers. The distributed data object management system implements consensus protocols to achieve consistency. The distributed data object management system is optimized based on metadata paths and data paths for write operations and read operations to support faster execution of operations for target workloads, resulting in lower latency than conventional data object management systems. In one embodiment, the distributed data object management system is built on top of an existing distributed computing storage (i.e., cloud storage system).

In operation, the distributed data object management system includes a distributed storage system having a local metadata-consensus information store in and one or more remote metadata-consensus information stores. A metadata-consensus information store is configured to store metadata-consensus information. The metadata-consensus information corresponds to erasure coded fragments of a data object and the metadata-consensus information includes instructions or operates to instruct on how to manage the erasure coded fragments. The distributed storage system further includes a local data store and one or more remote data stores. A data store is configured to store the erasure coded fragments of the data object. The local data store and the one or more remote data stores store the erasure coded fragments of the data object that correspond to metadata-consensus information in the local metadata-consensus information store and the one or more remote metadata-consensus information stores.

The distributed data object management system includes a distributed data object manager for performing distributed data object management operations including, interface operations, configuration operations, write operations, read operations, delete operations, garbage collection operations and failure recovery operations. The interface operations include: providing a customer access to a storage account associated with data objects of the customer and receiving a selection of a set of data centers where erasure coded fragments of the data objects are to be allocated. The data centers include a local data center and one or more remote data centers corresponding to the local metadata-consensus information store and the one or more remote metadata-consensus information stores and the local data store and the one or more remote data stores store. The interface operations further include receiving a selection of an erasure coding scheme that is used to generate the erasure coded fragments of the data objects. Based on the erasure coding scheme, the erasure coded fragments of the data objects are generated with a defined number of parity fragments and a defined number of data fragments. Various erasure coding schemes are detailed in U.S. patent application Ser. No. 14/752,595, filed Jun. 26, 2015, entitled "FLEXIBLE ERASURE CODING WITH ENHANCED LOCAL PROTECTION GROUP STRUCTURES", which is herein incorporated by reference in its entirety.

Configuration operations include accessing a data availability profile of a customer. The data availability profile identifies availability parameters selected for managing availability of data objects of the customer. Based on the data availability profile, a number of data centers for storing erasure coded fragments and metadata-consensus information of the data objects of the customer is determined for a mapping configuration of the erasure coded fragments and metadata-consensus information. The mapping configuration indicates a mapping for storing the erasure coded fragments and metadata-consensus information in the data centers.

With reference to a write operation, corresponding metadata writes and data writes for a write operation are performed in parallel using a metadata write path and a data write path, respectively, when writing to the local metadata-consensus information store and the one or more remote metadata-consensus information stores and the local data store and the one or more remote data stores. And, with reference to a read operation, corresponding metadata reads and data reads for a read operation are performed in parallel using a metadata read path and a data read path, respectively, when reading from the local metadata-consensus information store and the one or more remote metadata-consensus information stores and the local data store and the one or more remote data stores.

With reference to a delete operation, executing a delete operation can include performing one of the following: trimming earlier version instances of a data object, where a version instance comprises stored metadata-consensus information and corresponding erasure coded fragments of a version of the data object; deleting a specific version instance of the data object; or deleting an object instance of the data object, where an object instance comprises all stored metadata-consensus information and corresponding erasure coded fragments of the data object of a version of the data object. The garbage collection operation includes deleting triplet version column instances corresponding to metadata-consensus information and additional data and deleting corresponding erasure coded fragments. It is contemplated that the delete operation and the garbage collection operations can include deleting additional data associated with the metadata-consensus information and erasure coded fragments.

And the failure recovery operations include one of the following: recovering from a transient data center failure for a given data center, where table stores and object stores of the given data center are temporarily not accessible; or recovering from a permanent data center failure for a given data center, where table stores and object stores for the given data center are permanently not accessible.

Embodiments of the present invention can be described by way of an exemplary scenario with reference to an exemplary customer (e.g., tenant of a distributed computing system) accessing a distributed computing storage ("cloud storage system"). In particular, the customer can create a storage account associated with the distributed data object management system. The customer can specify a set of data centers where their data are striped across. In addition, the customer has the flexibility to choose an erasure coding scheme. The distributed data object management system can employ a classic n=k+m Reed Solomon coding, which generates m parity fragments from k data fragments. All n fragments are stored in different data centers, where 1) failures of up to m arbitrary data centers are tolerated; and 2) data can be reconstructed from any k out of n data centers. By allowing the customer to specify the set of data centers and choose the erasure coding scheme, the distributed data object management system gives the customer control of storage overhead and durability.

The customer may access the distributed data object management system via a defined set of operations (e.g., put, get and delete distributed data object management operations). In addition, the distributed data object management system may support versioning, where a new put does not overwrite existing data but rather creates a new version of the same data. The old version remains available until it is explicitly deleted. Additional distributed data object management operations include configuration operations, garbage collection operations and failure recovery operations, discussed in more detail herein. It is contemplated that the distributed data object management system can be developed and configured to operate on top of an existing cloud storage system that stores customer data objects in cloud blob storage and the metadata of the data objects in cloud table storage.

With reference to FIG. 1, embodiments of the present disclosure can be discussed with reference to an exemplary distributed computing system environment 100 that is an operating environment for implementing functionality described herein of a distributed data object management system. The distributed computing system environment 100 includes data center 110A, data center 110 B and data center 110 C. A data center can include several data center devices (e.g., servers, racks hardware, network devices, etc.) that support providing distributed computing system services. Each data center can include computing clusters (not shown) that operate based on a corresponding cluster manager (e.g., fabric controller) (not shown). The components of the distributed computing system environment 100 may communicate with each other via a network (not shown), which may include, without limitation, one or more local area networks (LANs) and/or wide area networks (WANs). Such networking environments are commonplace in offices, enterprise-wide computer networks, intranets, and the Internet.

FIG. 1 further illustrates an exemplary flow of storing a data object of 4 MB. The distributed data object management system divides a data object (e.g., blob 120) into 2 erasure coded fragments (e.g., data fragment 120A—a; and data fragment 120B—b) of 2 MB each. The distributed data object management system then encodes the data fragments to generate a third erasure coded fragment, specifically a parity fragment (e.g., parity fragment 120C—p) of size 2 MB. As used herein, erasure coded fragment can generally be used to refer to non-parity and parity data fragments. All the 3 erasure coded fragments (data fragment 120A, data fragment 120B and parity fragment 120C) can be stored in the blob storage in 3 data centers.

Data centers, as used herein, can be local data centers or remote data centers. A data center can be a local data or a remote data center relative to a data center device. For example, a data center most proximate to or in which a server or computing system operates can be a local data center. And, a data center that is not proximate to or the data center in which the server or computing system operates can be remote data center. Data centers can specifically be designated a local data centers and remote data centers based on configuration selections for the distributed computing system having the data centers. Other variations and combination of designating data centers as local or remote data centers are contemplated with embodiments of the present invention.

The data centers store data objects in the form of blob objects of erasure coded fragments and information about the erasure coded fragments as metadata. For example, the metadata, can consist of the pointers to blobs, as well as versioning information (e.g., version instance) that is stored in the table storage in the same data centers. It is contemplated that blob objects are associated with workloads, where advantageously have common properties. For example, common properties can include large storage space consumption, relatively cold data, where a small percentage of data is occasionally accessed across large volumes and object may be updated over time, but concurrent updates of the same object is rare. The common properties can be leveraged to develop optimized distributed data object management operations, as discussed herein in more detail. Distributed data object management operations for workloads with the predictable above-identified characteristics can be optimized for common cases—for example, where there is a single writer and multiple readers. The distributed data object management system operates to make the common case fast. An optimized implementation of the distributed data object management system can advantageously achieve optimal latency, which is single cross-DC round trip for both put and get operations. As used herein, put and get are used interchangeably with write and read, respectively.

The distributed data object management system is further operable to handle concurrency properly in situations where concurrency challenges occur. For example, the distributed data object management system tolerates data center failure. In the event of a data center being temporarily unavailable (or simply slow), the customers are able to continue to read and write data objects without much impact. The unavailable (or slow) data center may miss updates, which could potentially lead to conflict when they receive new updates again. Also, the retry put operation could be routed to a different data center and therefore conflict with the previously unfinished put. Therefore, even though concurrency is rare, it is crucial for the distributed data object management system to guarantee the rare case is correct. In this regard, the distributed data object management system can support external consistency (linearizability).

As mentioned, the distributed data object management system can be developed to operate on top of an existing cloud storage system. The blob and table storage within an individual data center may operate independently. Hence, while strongly consistent individually, the collection of the blob and table storage across multiple data center do not readily offer the desired linearizability. A technical challenge the distributed data object management system addresses is how to achieve optimal put with a single writer, while at the same time provide linearizability under concurrency, over the collection of individual blob and table storage across multiple data centers.

Figure 2:
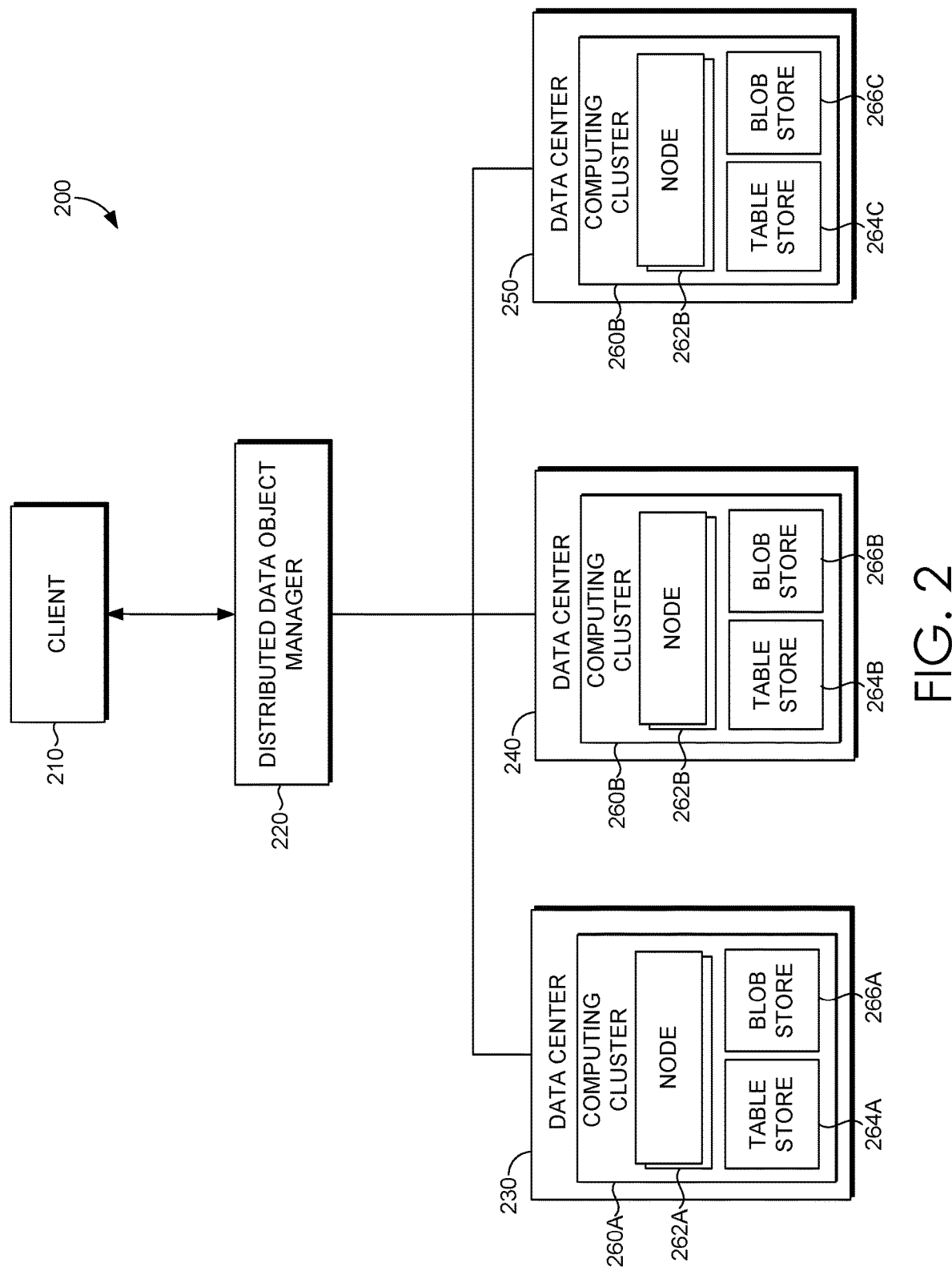
FIG. 2 is a block diagram of an exemplary distributed data object management system, in accordance with embodiments described herein.

Turning to FIG. 2, FIG. 2 illustrates a block diagram of a distributed data object management system 200. FIG. 2 includes similar components shown and discussed in FIG. 2 with additional components supporting the functionality of the distributed data object management system 200. FIG. 2 includes client device 210, distributed data object manager 220 and data center 230, data center 240 and data center 250. FIG. 2 further computing clusters (e.g., 260A, 260B and 260C), nodes (e.g., 262A, 262B and 262C), table stores (e.g., 264A, 264B and 264C) and blob stores (e.g., 266A, 266B and 266C) corresponding to the data center. In combination, the components of the distributed data object management system support functionality of the distributed data object management system 200 as described herein in more detail.

A system, as used herein, refers to any device, process, or service or combination thereof. A system may be implemented using components as hardware, software, firmware, a special-purpose device, or any combination thereof. A system may be integrated into a single device or it may be distributed over multiple devices. The various components of a system may be co-located or distributed. For example, although discussed for clarity as the distributed data object manager 220, operations discussed can be performed in a distributed manner via a distributed data object manager service (not shown) running the nodes in the different computing clusters and data centers. The system may be formed from other systems and components thereof. It should be understood that this and other arrangements described herein are set forth only as examples.

Having identified various components of the distributed computing environment and distributed data object management system, it is noted that any number of components may be employed to achieve the desired functionality within the scope of the present disclosure. The various components of FIG. 1 and FIG. 2 are shown with lines for the sake of clarity. Further, although some components of FIG. 1 and FIG. 2 are depicted as single components, the depictions are exemplary in nature and in number and are not to be construed as limiting for all implementations of the present disclosure. The distributed data object management system 200 functionality can be further described based on the functionality and features of the above-listed components.

Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

The distributed data object management system 200 architecture is configured based on several design considerations. The distributed data object management system 200 offers customers the flexibility to specify an erasure coding scheme, which results in different operating points in terms of storage overhead, bandwidth cost and durability. With reference to storage and durability, with standard durability, the distributed data object management system 200 applies k+1 erasure coding, which stores k+1 coded fragments in different data centers and tolerates single data center failure. With enhanced durability, the distributed data object management system 200 applies k+2 erasure coding, which stores k+2 coded fragments in k+2 data centers. This tolerates arbitrary 2 data center failures and achieves much higher durability.

With reference to FIG. 3, the table illustrates trade-offs of storage, bandwidth and durability and compares the costs and benefits of the distributed data object management system at various operating points to geo-replication. To tolerate single data center failure, geo-replication requires a storage overhead of 2×1.3=2.6 (where single DC storage overhead is a constant 1.3). With k+1 erasure coding, where k ranges from 2 to 5, the distributed data object management system reduces the storage overhead to between 1.9 and 1.5, a reduction of 27% to 42%. Even with enhanced durability tolerating 2 data center failures, the distributed data object management system again reduces the storage overhead between 2.1 to 1.9, a reduction of 19% to 27%. As shown in FIG. 3, compared to geo-replication, the distributed data object management system 200 achieves comparable durability while significantly reducing storage overhead, or much higher durability while still reducing storage overhead substantially. Nevertheless, the reduction in storage overhead comes at the additional cost of inflated cross-DC network traffic.

In the example above, in FIG. 1, of storing the 4 MB data object, in geo-replication, in addition to being stored in a local DC, the object is replicated and stored in a remote DC. The replication incurs 1× of cross-DC traffic. The distributed data object management system 200 with 2+1 erasure coding, divides the object and generates 3 coded fragments (a, b and p) with 2 MB each. The distributed data object management system 200 stores 1 fragment in the local DC and replicates 2 fragments to two remote DCs. The replication again incurs 1× cross DC traffic, the same as geo-replication. In general, with k+1 erasure coding, the cross-DC traffic is constant for both geo-replication and cross-DC erasure coding. This analysis readily extends to k+2 erasure coding. As shown in FIG. 3, the cross-DC traffic is slightly higher than geo-replication, inevitable to achieve higher durability.

With continued reference to the example of storing the 4 MB data object, in geo-replication, each data center has the full copy of the data object. Get can access the local DC and incur no cross-DC traffic. In contrast, with 2+1 erasure coding the distributed data object management system can only read half of the object from the local DC. Reading the other half from a remote DC always incurs cross-DC traffic, a 0.5× unit for a get operation. Generalizing the argument, FIG. 2 shows that the higher k is (in k+1 erasure coding), the higher cross-DC traffic get incurs.

When a data center fails, customer data originally stored at the failed DC can be rebuilt at a new DC. Geo-replication simply replicates every data object and thus incurs 1× of cross-DC traffic. In contrast, the distributed data object management system applies erasure decoding to reconstruct missing fragments, each incurring k times cross-DC traffic for arbitrary k+m erasure coding.

In an alternate approach for implementing the distributed data object management system, data objects are treated independently. To store a data object, the distributed data object management system splits the data object into multiple data fragments and generates parity fragments. All the coded fragments are dispersed and stored in different data centers. To retrieve the object, the distributed data object management system reads enough coded fragments from multiple data centers and reconstructs the data object. Hence, the distributed data object management system incurs cross-DC traffic when reading objects.

The decision to treat data objects independently can be a deliberate choice. One viable alternative is to first aggregate objects into logical volumes and then erasure code across objects different volumes. For instance, objects in data center A are aggregated into $vol_A$ and those in data center B into $vol_B$. Volumes are large, say in order of 100 GB. A parity volume $vol_P$ is generated by erasure coding $vol_A$ and $vol_B$, which is stored in yet another data center C.

This approach avoids cross-DC traffic when reading individual objects, as every object is available in its entirety in one of the DCs. However, this approach may present challenges in handling object deletion. Whenever an object is deleted $vol_A$ in data center A, it needs to be transmitted to data center C so as to be cancelled from $vol_C$. Hence, object deletion incurs cross-DC traffic. In addition, deleting objects from the logical volumes inevitably requires additional bookkeeping and garbage collection, resulting in greatly increased engineering complexity.

With reference to the primary approach detailed herein, the distributed data object management system design comprises the system architecture, data model, protocols for distributed data object management operations (i.e., put, get and delete operations). The distributed data object management system can include a global-scale cloud storage system that spans across many data centers in the world. The distributed data object management system can store immutable versioned objects.

Figure 4A:
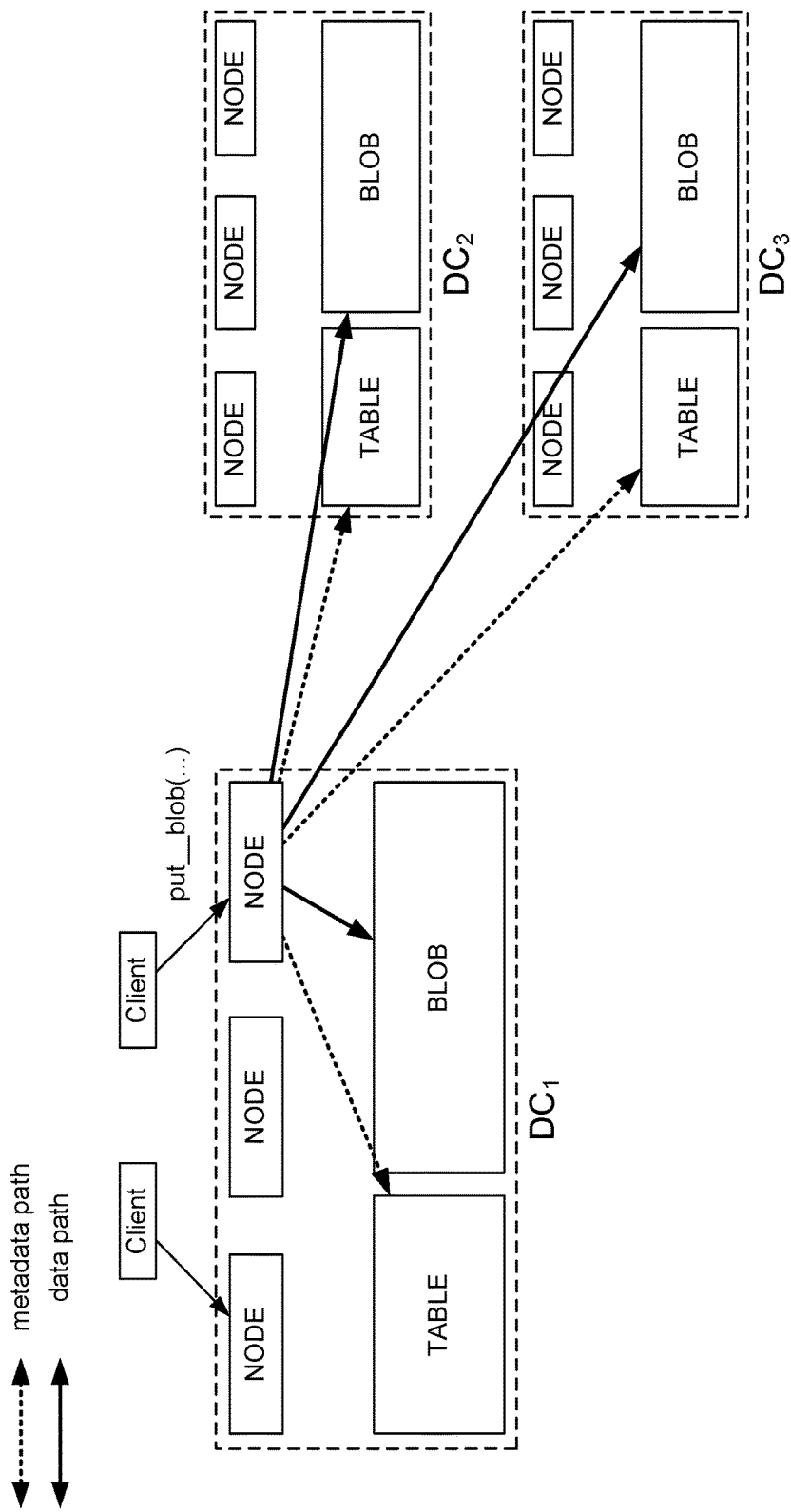
FIGS. 4A and 4B illustrate exemplary metadata paths and data paths for a distributed data object management system, in accordance with embodiments described herein.
Figure 4B:
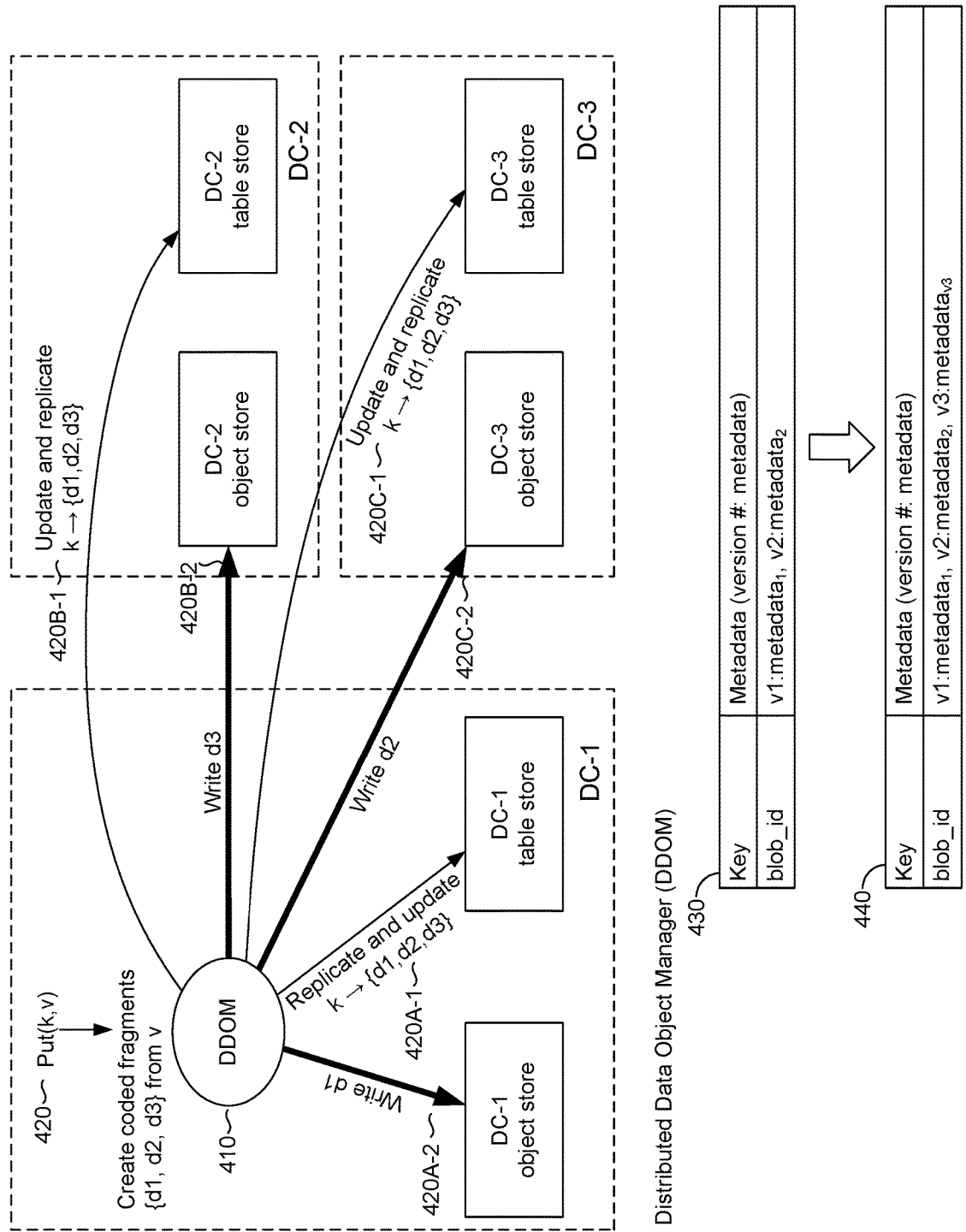

With reference to FIGS. 4A and 4B, FIGS. 4A and 4B show the system architecture 400 of the distributed data object management system. The system architecture 400 includes a distributed data object management manager—DDOMM 410 supporting an exemplary write operation, objects store (e.g., blob store), and table stores in data centers (DC-1, DC-2 and DC-3). A discussed, DDOM 410 may further operate as a plurality of distributed services or applications on nodes within each data center. The distributed data object management system, in particular as discussed in more detail herein, separates data path from metadata path. At a high level, on the data path, the distributed data object management system splits and encodes the object into data and parity fragments. For example, Put (k,v) 420 as shown in FIG. 4B, where k coded fragments (d1, d2, d3) are created from data object v. Each fragment is uniquely named by its content hash and store in a different DC. Updates to the object create new versions of metadata-consensus information in corresponding table stores and corresponding object writes in corresponding object stores. For example, replicate and update operations 420A-1, 420B-1 and 420C at DC-1 table store, DC-2 table store and DC-3 table store respectively. Also, in parallel, write coded fragments (write d1, write d2 and write d3) 420A-2, 420B-2, 420B-3 at DC-1 object store, DC-2 object store and DC-3 object store respectively. The version numbers, together with the hashes of the coded fragments in each version, consist of the metadata of the object. On the metadata path, the distributed data object management system replicates the metadata across data centers. As shown, a previous metadata entry 430 can be updated a new metadata entry 440, where the update support versioning, in that, a new put does not overwrite existing data but rather creates a new version of the same data. The old version remains available until it is explicitly deleted.

As discussed, the distributed data object management system may advantageously be implemented on top of an existing distributed storage system. In this context, the distributed data object management system development can be rapid in that mature and deployed systems are being re-used and the implementation simplifies the failure recovery and the deployment of the distributed data object management system, as distributed data object management system nodes can be implemented as stateless and can be readily integrated with the rest of the stateless cloud storage front-ends. An exemplary distributed storage system is described herein with reference to FIG. 16.

Operationally, the distributed data object management system stores fragments in different data centers in cloud object stores (e.g., blob stores). Additionally, the distributed data object management system replicates the object's metadata across multiple data centers and stores the metadata, in for example, cloud tables. The number of coded fragments, and thus the set of data centers storing the data object, is configurable during the account setup depending on the user desired tradeoff on durability versus cost.

As mentioned, the distributed data object management system can name each coded fragment by their content hashes. As a result, each coded fragment is immutable, as updating the object would result in completely different fragments and hashes. Hence, storing immutable fragments in the cloud blob stores makes the data path straightforward and greatly simplified. On the other hand, the metadata path of the distributed data object management system introduces subtle complexity.

The distributed data object management system can be constructed to be strongly consistent, geo-replicated metadata storage based on single-DC cloud tables. The distributed data object management system ensures strong consistency by implementing the Paxos and Fast Paxos consensus protocols, as described herein in more detail, based on cross-DC setting. The distributed data object management system can further be constructed to jointly optimize the data path and metadata path to achieve a single cross-DC round trip for read and write operations. An alternate approach may execute the data and metadata path sequentially: a distributed data object management system node completes the data path write of the blob first before starting on the metadata path. As such, as used herein, parallel read and writes can exclude sequential reads and writes where data path reads and writes are executed to completion first before starting on the corresponding metadata path reads and writes or metadata path reads and writes are executed to completion first before starting on the corresponding data path reads and writes. While doing sequential reads and writes may guarantee that data is durably written at multiple DCs before the data becomes externally visible, each write operation requires at least two cross-DC round trips. As discussed herein, embodiments of the present disclosure include the data path and metadata path operating to achieve a single cross-DC round trip for both read and write.

The distributed data object management system is further constructed to support garbage collection efficiently and promptly. When old versions or an entire data object is deleted, the distributed data object management system can remove obsolete data and/or metadata from the underlying cloud storage. Further, when the data path fails partially, some fragments may be written, which need to be garbage collected. Both are non-trivial as the distributed data object management system garbage collection mechanism can be constructed to handle data center failures while ensuring data consistency and durability.

The distributed data object management system operates based on a consensus algorithm (e.g., Paxos) as described herein. The Paxos algorithm may be implemented using APIs of the cloud storage system. On the metadata path, the distributed data object management system implements a Paxos consensus protocol to serialize the operations on each data object. More specifically, the distributed data object management system can implement the Paxos on top of cloud tables. The Paxos algorithm provides a mechanism to reach consensus among a set of acceptors and one or more proposers. By way of background, a Paxos algorithm includes each proposer initiating a Paxos voting process by first picking a distinguished ballot. All ballots can be unique and can be compared to each other. The proposer sends requests to the acceptors, and associate each request with a proposal value. Each acceptor decides whether to accept a request based on its own state. The proposal value is committed when it is accepted by a quorum of acceptors. The acceptors update their states when a request or proposal value is accepted.

In one implementation, each distributed data object management system node is a proposer. The acceptors in Paxos are typically active nodes or processors (e.g., distributed data object manager service) which are capable of comparing the ballot of an incoming request with their own state and deciding whether to accept the request. In the distributed data object management system, the acceptor can be implemented using a cloud table storage. In this regard, a node operating as a proposer, initiates a voting process based on selecting a distinguished ballot. The node sends the request to one or more nodes operating as acceptors, the request includes a value for the distinguished ballot. Each of the one or more nodes operating as acceptors determine whether to accept the request or value based on comparing the ballot to a state at the one or more nodes. Comparing the ballot and accepting the request may be implemented via atomic conditional update to the table. Accordingly, Paxos takes two phases to reach consensus, where phase 1 prepares a ballot and phase 2 accepts a value. Since each phase takes one round trip, applying Paxos in the distributed data object management system results in two cross-DC round trips for metadata writes.

In an optimized implementation, the distributed data object management system employs two types of rounds in the Fast Paxos: fast-round and classic-round. A fast round sends a Pre-Accept request and takes a single round trip to reach consensus. A classic-round resembles the two phases in Paxos and takes two round trips. The fast-round demands a larger quorum than that in Paxos. By way of example, consider a case with 3 acceptors. Paxos is able to reach consensus with 2 out of the 3 acceptors (quorum size of 2). In comparison, Fast Paxos only reaches consensus with all the 3 acceptors (quorum size of 3).

The success of the data path requires multiple data centers to be online to make progress, as it is easier to satisfy the demand of a larger quorum, and suits the implementation needs in Fast Paxos. For example, the distributed data object management system requires at least 3 data centers to stripe the coded fragments (with 2+1 erasure coding). Hence, the data path does not succeed unless there are at least 3 data centers available, which makes it easy to satisfy the larger quorum requirement. The distributed data object management system is configured to implement both the Paxos and Fast Paxos. As used herein, Fast Paxos can refer to implementing a consensus protocol including a fast-path protocol and a slow-path protocol, as described herein in more detail. In particular, Fast Paxos implements a contextually based selection of fast-round read or write or classic-round read or write operations, corresponding the fast-path and slow-path protocols.

The distributed data object management system operates to store metadata-consensus information that instruct on how to manage corresponding erasure coded fragments. As used herein, instruct can refer to providing information that is used for managing and performing specific types of distributed data object management operations. In particular, the metadata portions of the metadata-consensus information can store specifically defined information defined in a metadata storage layout. Further, to implement the Paxos, the distributed data object management system operates to persist the Paxos states in addition to the metadata for the object in the consensus portion of the metadata-consensus information. The distributed data object management system, in one exemplary implementation, conveniently stores the Paxos states together with the metadata in the cloud table, one table row per object, with dynamic number of columns (e.g., version columns in version column instances). The layout of each table row is shown in FIG. 5.

With reference to FIG. 5, each object may have multiple versions (e.g., 520A, 520B and 520C). The versions, in one example, are represented by consecutive natural numbers, starting from 1. A distributed data object management system write operation leads to a new version of the object. For each version, the distributed data object management system invokes a separate Paxos instance to ensure consistency in the event of races among multiple writes and failures. The states (e.g., 530A, 530B, 530C) of all the Paxos instances can be stored in the same table row as part of the metadata for the data object. Specifically, the metadata contains a triplet of columns for each version of the object. The triplet includes highest ballot seen 530A and highest ballot accepted 530B for recording the state of each Paxos instance or version column instance. The triplet includes highest accepted value 530C, which contains the metadata information, including the erasure coding scheme, the name of each coded fragment, whether it is one of the original or parity fragments and which data center the fragment is stored at.

The distributed data object management system additionally maintains a set of known committed versions (e.g., known committed version 510) for all those that have been committed. As discussed herein in more detail, this provides a hint to facilitate both write and read operations. This operates as a hint (e.g., hint element) in that newly committed versions are added to the set asynchronously, or beyond the critical path of write operation. Hence, while all the version numbers in the set are guaranteed to have been committed, the latest committed version number might have to be included.

Figure 6:
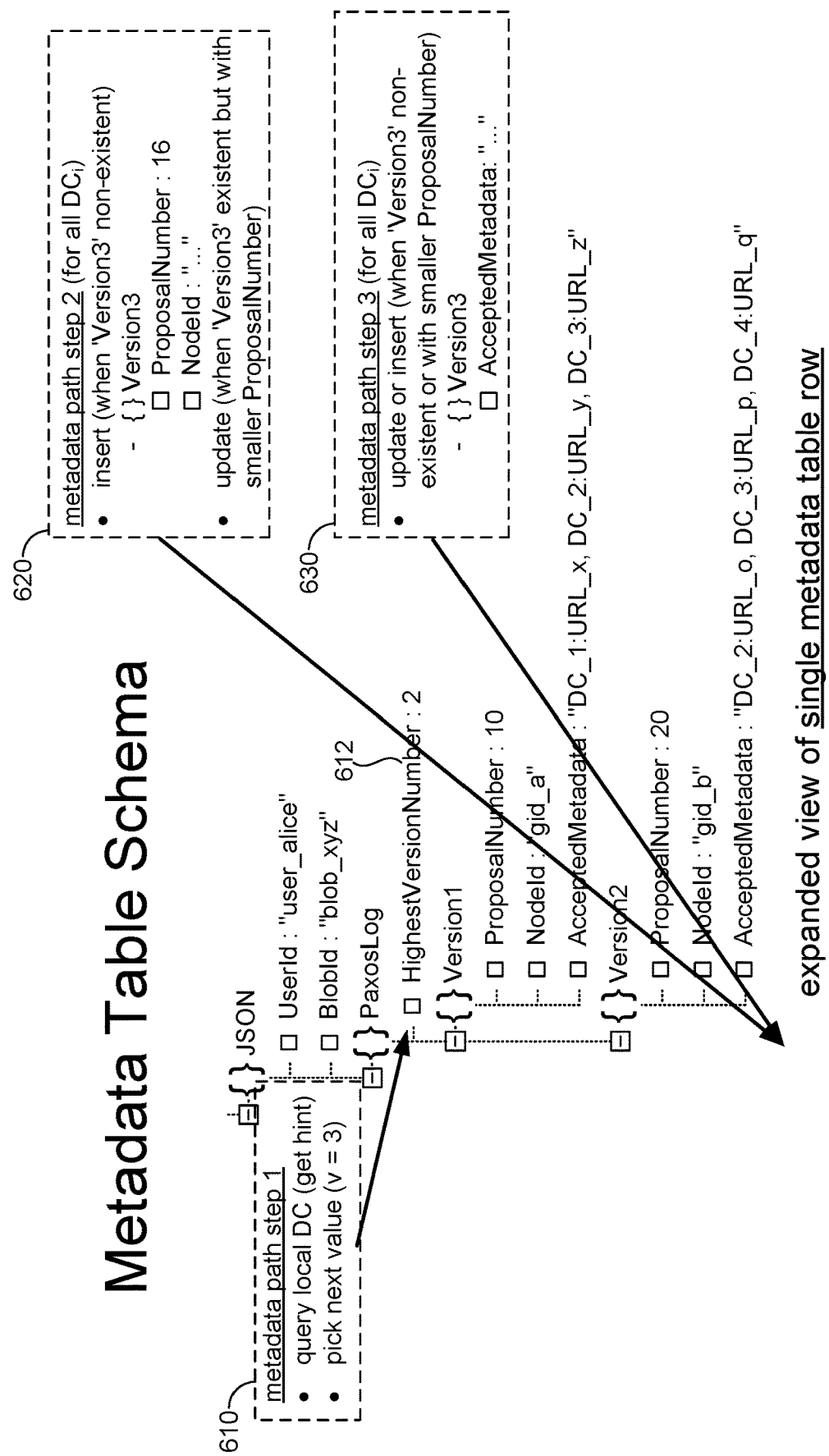
FIG. 6 illustrates an exemplary metadata table schema and update flow for a distributed data object management system, in accordance with embodiments described herein.

The distributed data object management system operates to perform write operations. Write operations can be performed in metadata writes and data writes in parallel as discussed herein. In particular, metadata writes can be performed either as metadata writes common-case or metadata write contention-case. With reference to metadata write common case, the metadata path begins with choosing a proper new version number to run Fast Paxos. Since version numbers are consecutive, the new version number needs to be next to the most recently committed version. While it is safe to use an outdated version (in which case the distributed data object management system node will later realize its mistake and retry with a higher number), it is unsafe to choose a higher version number and result in non-consecutive versions. The distributed data object management system node identifies the proper version in an optimistic fashion. Specifically, the distributed data object management system reads known committed version from the table in its local DC, then uses the next higher number as the chosen version number to invoke the corresponding Fast Paxos instance. As shown in FIG. 6, illustrating an exemplary metadata table scheme with reference to a metadata write common case operation, metadata path step 1 610, queries the local data center and utilizes the known committed version (i.e., HighestVersionNumber 612), in this case 2, as a hint of what the higher version number should be, in the case v=3 (i.e., Version3).

With the version number chosen, the distributed data object management system node replicates a Pre-Accept request to the tables in all the data centers. Each request is an atomic conditional update to the corresponding table in a single data center. If there are no competing request on the same version, the Pre-Accept request succeeds in updating the table row. Otherwise, the Pre-Accept request will be rejected by the table and leave the table row unchanged.

With continued reference to FIG. 6, metadata path step 2 620 illustrates the Pre-Accept request for Version3, with ProposalNumber 16.

Whenever the distributed data object management system node receives a fast quorum of positive Pre-Accept responses, the corresponding version is considered to have been committed. The distributed data object management system node asynchronously replicates a commit confirmation to all the DCs to update the set of known committed versions to include the recently committed version. The commit confirmation can also be an atomic conditional update, which only succeeds if the version number is not yet included in the current set. With continued reference to FIG. 6, metadata path step 3 630 illustrates the commit confirmation to all DCs to update the known committed version.

Since the commit confirmation is completed asynchronously, the critical path only invokes the Pre-Accept request and response. Hence, the above described metadata write involves only one cross-DC round trip and is referred to as the fast-path protocol or fast-round of the Fast Paxos. When there is no contention, the fast path succeeds.

With reference to metadata write contention-case, the fast path may not succeed, i.e., the distributed data object management system node cannot collect a fast quorum of positive Pre-Accept responses. The contention may come from concurrent updates to the same versions or a distributed data object management system node trying to recover from failures by re-committing the same or a different value to an ongoing version. In this case, the distributed data object management system enters what is referred to as a slow path protocol or classic-round of the Fast Paxos to perform classic Paxos in order to guarantee safety in case of contention.

On the slow path, a distributed data object management system node first picks a distinguished ballot number and then replicates a Prepare request to write the ballot to all the metadata tables and wait for a majority of responses. The Prepare request is conditional update operation. The operation succeeds only if the highest ballot seen is more than the ballot in the Prepare request. The operation also returns the entire row as a result.

Upon collecting a majority of successful replies, the distributed data object management system node needs to pick a value to commit. The rule for picking the value is categorized into three cases. Rule 1—the distributed data object management system looks for the highest accepted ballot in the replies. If there is one, the value from the reply is picked. Rule 2—the replies contain no accepted value, but rather pre-accepted values. The distributed data object management system node picks the pre-accepted value that appears more than others (if any) from the replies. Both rule 1 and rule 2 imply the possibility of an ongoing Paxos instance, so the distributed data object management system node picks the value so as to complete the Paxos instance first. It then starts with a new version and follows the fast path to commit its current metadata. In rule 3, there is neither a pre-accepted or accepted value, which implies no real impact from contention. The distributed data object management system picks its current metadata as the value and proceeds to next steps.

Once the distributed data object management system node picks a value, the distributed data object management system node replicates an accept request to all the metadata tables. The accept request can be an atomic conditional update; the accept request succeeds in writing the highest accepted ballot and highest accepted value if neither highest accepted ballot seen and highest accepted ballot is larger. As soon as a majority of Accept requests succeed, the distributed data object management system node assesses the corresponding metadata write as completed and sends an acknowledgment to clients. Additionally, a commit confirmation can be replicated in the background, as described above.

The distributed data object management system operates to perform read operations. Read operations can be performed with metadata path reads and data path reads executed in parallel as discussed herein. In particular, metadata path reads can be performed either as metadata read common-case or metadata read contention-case. In operation, to get the metadata of the latest object version, it is insufficient for the distributed data object management system to only read the corresponding metadata table for its local DC. This can be because the local data center might not be part of the majority quorum that has accepted the latest version. To ensure correctness, the distributed data object management system can read the metadata row from more than one data center.

In the metadata read common-case, known committed versions are already updated and includes latest committed version (for example, version k). The metadata table row from the local data center obtains version k. The metadata table row from a non-local data center confirms the lack of higher committed versions than k. Hence, in the exemplary case where the metadata is replicated to 3 data centers, the metadata from 2 data centers (one local and one non-local) leads to a decisive conclusion that version k is the latest committed version. It is therefore safe for the distributed data object management system node to return version k to clients.

In general, however, the distributed data object management system node may operate to read the metadata table row from all the data centers. Whenever a majority rows have matching known committed versions (i.e., fast path protocol or fast-round) and have not accepted any value for a higher version, the distributed data object management system node returns the metadata of the highest committed version.

In the metadata read contention-case the replies, unfortunately, are returned containing a higher version with accepted value while not included known committed version, the distributed data object management system node needs to follow a slow path protocol (or classic-round) similar to the one in the write operation. This is to confirm whether the higher version has indeed been committed, despite that the version is not included in known committed versions and the metadata tables in certain data centers may have missed the quorum.

The distributed data object management system operates to perform joint optimization of data and metadata write and read operations. The data path of the distributed data object management system can be straightforward: the distributed data object management system node encodes the data to k original fragments and m parity fragments, k and m are configurable. Then the distributed data object management system node computes a content hash for each fragment, and uses the hash value as the key to write each fragment to a separate data center. When naively combining the data path with the earlier metadata path, the distributed data object management system node serializes the two paths, resulting in one or more cross-DC round trips. To reduce latency, the distributed data object management system can be optimized to run the data and metadata paths in parallel. This is potentially problematic because either the data or metadata path could fail while the other one succeeds. Below, the write and read (put and get) operations are further described in the context of coping with this challenge and ensuring end-to-end correctness.

With reference to the write (put) operation, in operation, after generating the coded fragments and calculating their content hashes, the distributed data object management system node launches both the data path and metadata path in parallel. In the common case, the distributed data object management system node waits for both the data path and the metadata path to finish before acknowledging clients. Furthermore, the distributed data object management system replicates the commit confirmation only after both the data path and the metadata path are completed. In other words, the distributed data object management system ensures that a known committed version only includes those versions whose data and metadata have both been successfully committed.

In one uncommon case, the data path succeeds, while the metadata path fails. Now, the fragments stored in the cloud blobs become useless. The distributed data object management system can delete these fragments and reclaim storage through a cleaning process, which first executes Paxos instance to update the current version to no-op (e.g., delete record) and then removes the fragments from the corresponding blob stores in all the data centers. In another uncommon case, the data path fails, but the metadata path succeeds. This is rather subtle, as it creates a challenge for the read (get) operation, as addressed next.

With reference to the read (get) operation, in operation, a naïve way to perform get is to first read the latest metadata and then retrieve the coded fragments. To reduce latency, the distributed data object management system chooses an optimistic approach and parallelizes the metadata path and data path.

For a get request, the distributed data object management system node first reads from the local DC the corresponding metadata table row. It obtains known committed version, as well as the names and locations of the coded fragments of the latest version. The distributed data object management system node can then immediately start reading the coded fragments from the different data centers. Separately, it launches a regular metadata read to validate that the version is indeed the latest. If the validation fails, the distributed data object management system node realizes there is a newer version. It in turn has to redo the data path by fetching a different set of coded fragments. This results in wasted efforts in its previous data fetch. Such potential waste, however, only happens when there are concurrent writes on the same object, which is rare.

Because the data path and metadata path are performed in parallel during put, it is possible (though rare) that the coded fragments for the latest committed version have not been written to the blob storage at the time of read. This happens if the metadata path in the put finishes before the data path, or the metadata path succeeds while the data path fails. In such a case, the distributed data object management system node can operate to fall back to read the previous version, as specified in known committed version.

The distributed data object management system is operable to support two types of deletion operations: trimming earlier versions (e.g., version instances) and deleting entire data objects (e.g., object instances). To control the size of the metadata table rows, the distributed data object management system limits the number of versions for each object. Once the limit is reached, writing a new version automatically trims the earliest version.

Deleting a specific version is processed as a special update of the object's metadata. The distributed data object management system operates to execute the Paxos algorithm to create a new version to record a deletion record for the deleted version. Once the deletion record is successfully committed, the distributed data object management system garbage collects and reclaims the storage space occupied by the coded fragments of the deleted version.

The distributed data object management system also includes a distributed data object manager for performing distributed data object management operations including garbage collection operations, delete operations, configuration operations, and failure recovery operations. With reference to the garbage collection operation, the garbage collection process includes deleting the coded fragments and truncating the column (i.e., version column instance) for the deleted version in the metadata table row. The distributed data object management system follow three steps: (1) read the metadata row and identify the column corresponding to the deleted version; (2) send the deletion request to blob storage to delete the coded fragments; (3) remove the column for the deleted version from the table storage. The second step has to occur before the third one in case the garbage collection process is interrupted and the coded fragment may become orphans without proper metadata point to them in the table storage.

With regard to deleting the entire object, the distributed data object management system executes Paxos to commit a tombstone as the highest version. Then the distributed data object management system deletes the coded fragments corresponding to all the versions of the object. Finally, the distributed data object management system starts to delete the entire table row from the tables across all the data centers. This requires extra care. Otherwise, if removed brutally, a new put operation of the same object may lead the system into an abnormal state. The put operation could start at a data center where the table row is already deleted. The put operation would therefore assume the object never existed and choose the smallest version number. Committing this version number could be dangerous before the metadata table row is deleted from all the data centers, as this could result in conflict and ambiguity during future failure recovery.

With regard to the above-described scenario, the distributed data object management system resorts to two-phase commit to delete the metadata table row. In the first phase, the distributed data object management system marks the rows in all the data centers as "prepared_to_delete". After this, any other get or put operations are temporarily disabled on this object. Then, in the second phase, all the rows are actually removed from the table storage. The disadvantage of this approach is that it requires all the data centers online. Data center failures or network partitions may pause the process and make the row unavailable (but can still continue after data center recovers or network partition heals).

Turning to the configuration operations and failure recovery operations, two practical aspects of the distributed data object management system include how to configure which set of data centers to use for storing data fragments and replicating metadata, and how to handle future failures. The distributed data object management system supports a large number of customers, each of which is associated with a corresponding storage account. Each distributed data object management system account is configured with a collection of three or more data centers that replicate the metadata and/or store the coded data fragments. The customer specifies a desired fault tolerance goal, and an acceptable cost of storing the data. The configuration determines the number of data centers that the customer's data will be stored, which in turn determines coding rate. For example, if the customer wishes to protect against one data center failure and is willing to pay 17% extra for the protection, a 6+1 erasure code can be used, and there should be 7 datacenters in the configuration. Furthermore, 3 among the 7 data centers are designated as metadata data centers that replicate metadata in addition to storing coded data. The choice of data centers is determined by user preferences. For example, a cloud storage provider could choose the data center where the user makes the most data access and other close-by data centers for better performance.

The mapping from each distributed data object management system account to a set of data centers is stored in a separate configuration service external to the distributed data object management system. To service get and put requests for an account, the distributed data object management system retrieves the account's data center configuration from the external service and caches the information for future requests. The information may be cached for to threshold period of time.

With regard to changing the data center configuration, the set of data centers for an account may be changed either due to changing user preferences or recovering from a failed data center. Each new data center configuration for an account is associated with a monotonically increasing identifier, view-id. Since configuration changes are made infrequently, a history of data center configuration can be stored. The view-id is attached to each version of the object metadata. To change to a new data center configuration for an account, the distributed data object management system enters a grace period during which the cached data center configuration in all of the distributed data object management system nodes are invalidated. During the grace period, it is possible that some nodes use the old data center configuration while others use the new one. To ensure metadata consistency in this scenario, whenever the distributed data object management system writes a new version of the metadata whose previous version has the old data configuration, its Paxos implementation obtains quorums in both the old and new configuration. Therefore, the data centers in the old and new configuration concurrently agree on the same metadata version.

The migration of coded fragments from the old configuration of data centers to new ones can happen outside the grace period and in the background. Whenever an object's fragments have been moved or re-generated in the new data centers, the migration worker writes a new version of metadata from the object. Before the completion of data migration, it is possible that a get operation fails to obtain metadata or data in the new configuration. In this situation, the distributed data object management system retries the operation under the previous configuration.

The distributed data object management system supports two types of failures: distributed data object management system node failure and data center failures. Since each distributed data object management system node is stateless, handling node failure can be include launching new machines to replace failed ones. Data center failure can be handled based on data center recovery operations.

Transient data center failures include temporary outages of the blob and table storage service in a data center. The distributed data object management system copes with transient data center failure by design.

The table service and blob storage service are reliable in the face of machine failures within a data center. When an entire data center becomes unavailable, such as a temporary network partition or an entire data center breakdown, the distributed data object management system can still service get and put requests, albeit at degraded performance. When handling a put, the distributed data object management system takes two cross-DC roundtrips instead of one, because there are not enough data centers to make up a Fast Paxos quorum when 1 out of 3 data centers replicating the metadata is down. When handling a get, the distributed data object management system reads the parity fragment as well as data fragments to reconstruct the entire data object.

When a datacenter comes back online after a crash, the data center systems are configured to update the metadata rows in its table service and data fragments in the blob storage. A number of recovering clients are launched to scan through objects. For each object, the distributed data object management system issues a normal read request except that it does not pre-fetch the data. If the local version match the global version, nothing needs to be done; if the local version is behind, the recovering process then reads the latest data fragments, re-calculates the fragment that belongs to the local data center and writes it to the blob storage consistently with the metadata.

With regard to permanent data center failure, such as when data center fails catastrophically, the blob and table storage service within the data center may also experience long term outages. These types of failures can be categorized as permanent data center failures.

The distributed data object management system handles permanent data center failures by triggering a data center configuration change which replaces the failed data center with a healthy one. This process is identical to that required for the configuration change described above. Except the distributed data object management system also needs to re-generate lost code fragments instead of simply moving existing ones. In addition, the distributed data object management system prioritizes work done to handle permanent data center failures over that of ordinary data center configuration changes.

Turning now to FIGS. 8-14 a plurality of flow diagrams are provided illustrating methods for implementing distributed data object management. The methods can be performed using the distributed data object management system described herein. In embodiments, one or more computer storage media having computer-executable instructions embodied thereon that, when executed, by one or more processors, can cause the one or more processors to perform the methods in the distributed data object management system having a distributed storage system. The distributed storage system includes a local metadata-consensus information store and one or more remote metadata-consensus information stores. A metadata-consensus information store can be a table store for metadata-consensus information. The metadata-consensus information corresponds to erasure coded fragments of a data object and instructs on how to manage the erasure coded fragments.

The metadata-consensus information comprises one or more of the following: a known committed version, where the known committed version operates as a hint element in write operations and read operations; a pointer to the corresponding erasure coded fragments of the data object; one or more triplets of version column instances, a triplet of version columns comprising: a highest ballot number seen; a highest accepted ballot number; and a highest accepted value.

The distributed storage system further includes a local data store and one or more remote data stores. A data store is an object store (e.g., blob) that stores the erasure coded fragments of the data object. The local data store and the one or more remote data stores store the erasure coded fragments of the data object that correspond to the metadata-consensus information in the local metadata-consensus information store and the one or more remote metadata-consensus information stores. The distributed data object management system supports writing and reading operations to and from the distributed storage system. In operation, corresponding metadata writes and data writes for a write operation are performed in parallel using a metadata write path and a data write path, respectively, when writing to the local metadata-consensus information store and the one or more remote metadata-consensus information stores and the local data store and the one or more remote data stores.

Figure 7:
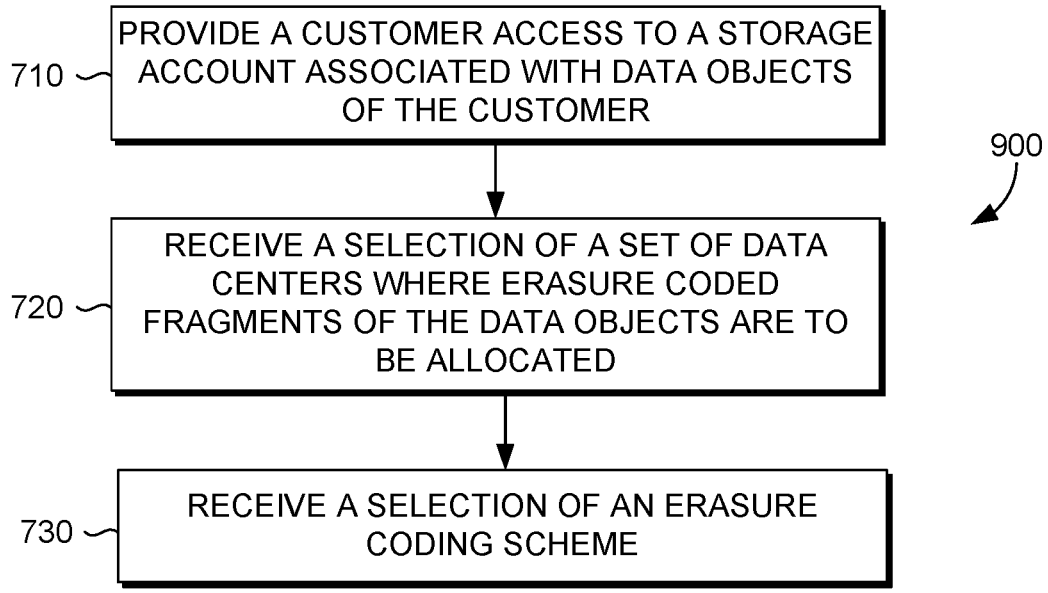
FIG. 7 is a flow diagram showing an exemplary method for implementing a distributed data object management system, in accordance with embodiments described herein.

Turning now to FIG. 7, a flow diagram is provided that illustrates a method 700 for executing interface operations for implementing distributed data object management. Initially at block 710, a customer is provided access to a storage account associated with data objects of the customer. At block 720, a selection of a set of data centers where erasure coded fragments of the data objects are to be allocated is received. At block, 730, a selection of an erasure coding scheme is received. The erasure coding scheme is used to generate erasure coded fragments of the data objects, where, based on the erasure coding scheme, the erasure coded fragments of the data objects include a defined number of data fragments and a defined number of parity fragments.

Figure 8:
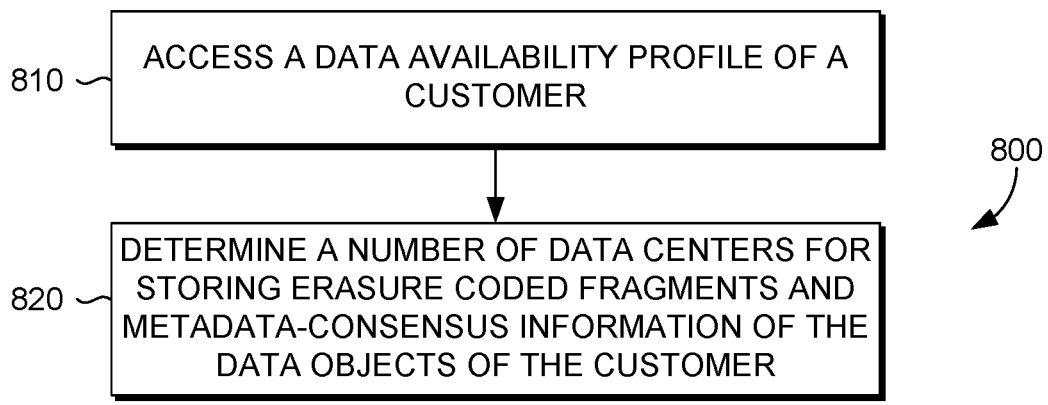
FIG. 8 is a flow diagram showing an exemplary method for implementing a distributed data object management system, in accordance with embodiments described herein.

With reference to FIG. 8, a flow diagram is provided that illustrates a method 800 for executing configuration operations for implementing distributed data object management. Initially at block 810, a data availability profile of a customer is accessed. The data availability profile identifies availability parameters selected for managing availability of data objects of the customer. At block 820, based on the data availability profile, a number of data centers for storing erasure coded fragments and metadata-consensus information of the data objects of the customer is determined for a mapping configuration. The mapping configuration for the erasure coded fragments and metadata-consensus information indicates a mapping for storing the erasure coded fragments and metadata-consensus information in the data centers.

Figure 9:
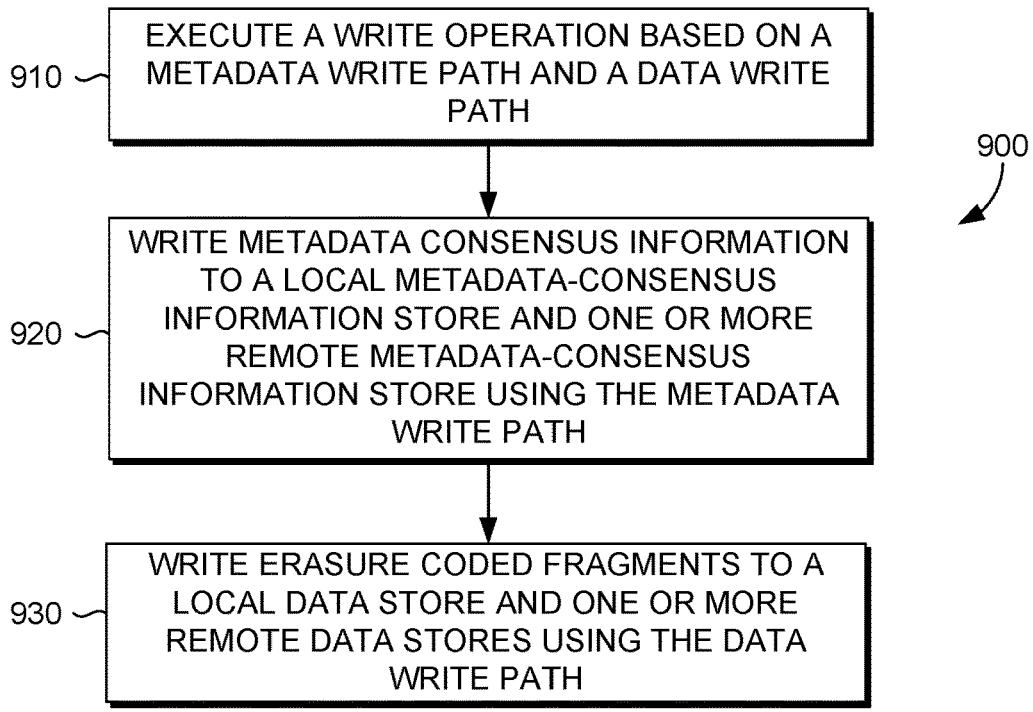
FIG. 9 is a flow diagram showing an exemplary method for implementing a distributed data object management system, in accordance with embodiments described herein.

Turning now to FIG. 9, a flow diagram is provided that illustrates a method 900 for executing a write operation for implementing distributed data object management. Initially at block 910, a write operation is executed based on a metadata write path and a data write path, where writing using the metadata write path and the data write path is performed in parallel. Writing using the metadata write path and the data write path performed in parallel includes: determining that writing using the data write path was successful while writing using the metadata write path was unsuccessful; and initiating a failure-based deletion operation, where the failure-based deletion operation operates to delete erasure coded fragments associated with the successful data write path.

At block 920, the write operation further includes writing, to a local metadata-consensus information store and one or more remote metadata-consensus information stores, using the metadata write path, metadata-consensus information of erasure coded fragments of a data object, the metadata-consensus information corresponds to erasure coded fragments of a data object and instructs on how to manage the erasure coded fragments. At block 930, the write operation also includes writing, to a local data store and one or more remote data stores, using the data write path, the erasure coded fragments of the data object.

The write operation can be performed for common-case writes and contention-case writes. Executing the write operation for a common-case includes: determining a next version number to execute the write operation using a fast-slow consensus scheme, the next version number is determined based on a known committed version number at the local metadata-consensus information store; and initiating a fast-round write using a fast-path protocol of the fast-slow consensus scheme to update the local metadata store and the one or more remote metadata-consensus information store, the fast-path protocol comprises a pre-accept request of the fast-round write for updating the local metadata store and the one or more remote metadata-consensus information store.

Executing the write operation for a contention case further includes: determining that the fast-round write failed based on the pre-accept request not receiving quorum of acceptances for the fast-round write; and initiating a classic-round write using a slow-path protocol of the fast-slow consensus scheme to update the local metadata-consensus information store and the one or more remote metadata-consensus information store, the slow-path protocol comprises both a prepare request and an accept request of the classic-round write for updating the local metadata store and the one or more remote metadata-consensus information stores. Executing the write operation does not overwrite existing metadata-consensus information or erasure coded fragments of the data object, the write operation operates to create new versions of the metadata-consensus information or erasure coded fragments of the data fragments associated with old versions that remain available until explicitly deleted.

Figure 10:
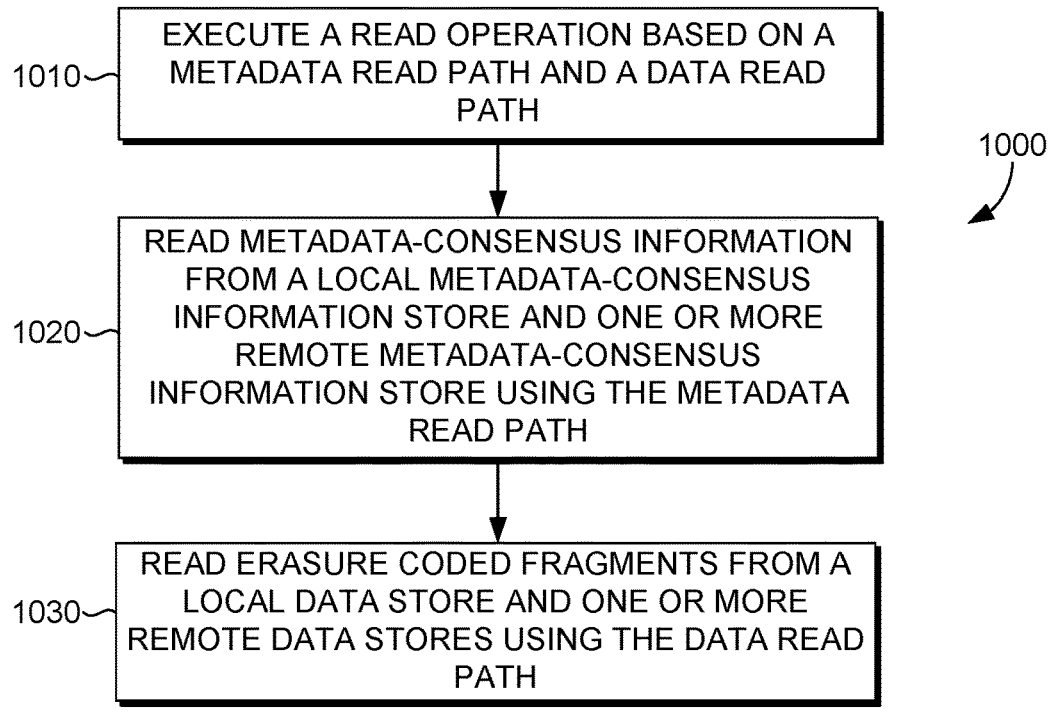
FIG. 10 is a flow diagram showing an exemplary method for implementing a distributed data object management system, in accordance with embodiments described herein.

Turning now to FIG. 10, a flow diagram is provided that illustrates a method 1000 for executing a read operation for implementing distributed data object management. Initially at block 1010, a read operation is executed based on a metadata read path and a data read path, where reading using the metadata read path and the data read path is performed in parallel. Reading using the metadata read path and the data read path performed in parallel includes: determining that writing using the data write path was unsuccessful while writing using the metadata write path was successful; and initiating a next read operation to read a previous version number prior to a version number associated with the successful metadata write path.

At block 1020, the read operation further includes reading, from the local metadata-consensus information store and the one or more remote metadata-consensus information stores, using the metadata read path, metadata-consensus information of the erasure coded fragments of a data object. At block 1030, the read operation also includes, reading, from the local data store and one or more remote data stores, using the data read path, the erasure coded fragments of the data object.

The read operation can be performed for common-case read and contention-case read. Executing the read operation for a common-case includes: initiating a fast-round read using a fast-path protocol of the fast-slow consensus scheme, where the fast-path protocol comprises reading from each of the local metadata store and the one or more remote metadata-consensus information store; and returning a matching known committed version, where the matching known committed version is matched and stored at a majority of the local metadata store and the one or more remote metadata-consensus information stores; and where a next version number has not been accepted at any of the local metadata store or the one or more remote metadata-consensus information stores.

Executing the read operation for a contention case further includes: determining that a next version number has been accepted at least one of the local metadata store and the one or more remote metadata-consensus information stores; and initiating a classic-round read using a slow-path protocol of the fast-slow consensus scheme, where the slow-path protocol comprises determining whether the next version number is a correct version number for each of the local metadata store and the one or more remote metadata-consensus information stores.

Figure 11:
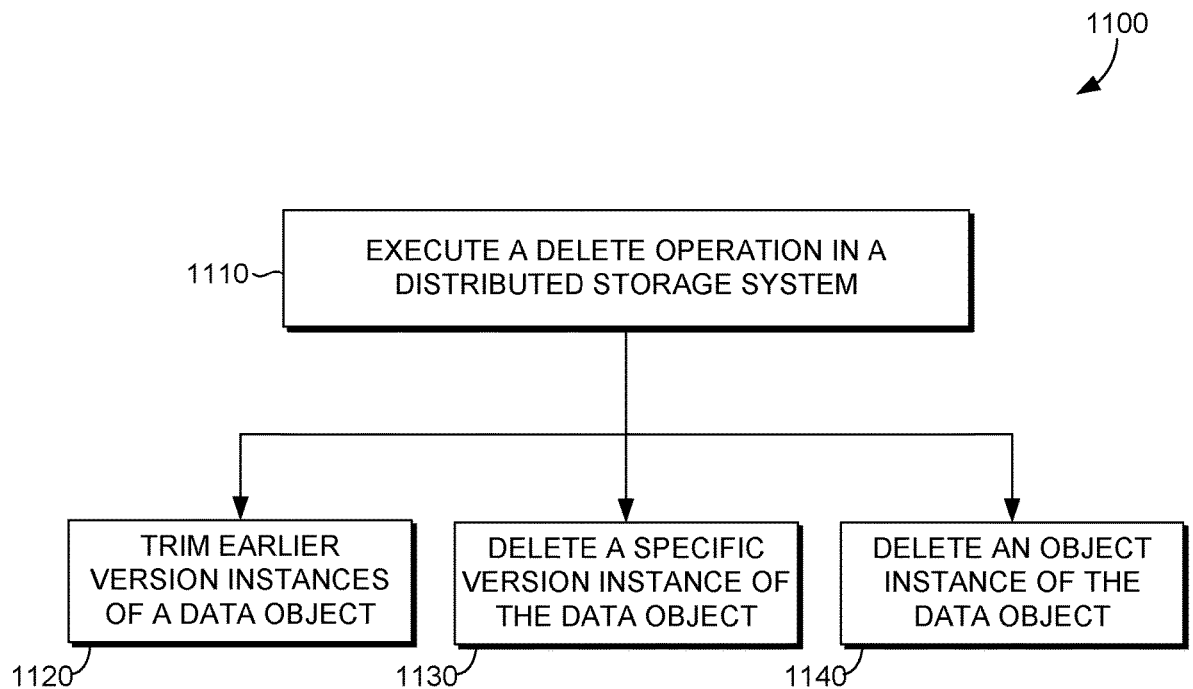
FIG. 11 is a flow diagram showing an exemplary method for implementing a distributed data object management system, in accordance with embodiments described herein.

Turning now to FIG. 11, a flow diagram is provided that illustrates a method 1100 for executing a delete operation for implementing distributed data object management. Initially at block 1110, a delete operation is executed in a distributed storage system, the delete operation including one of the following operations at block 1120, block 1130 and block 1140, described in more detail below. At block 1120, trimming earlier version instances of a data object, a version instance includes stored metadata-consensus information and corresponding erasure coded fragments of a version of the data object. Trimming earlier version instances is based on: determining that a version instance count limit has been met; writing a new version instance of the data object; and automatically trimming an earliest version instance of the data object.

At block 1130, deleting a specific version instance of the data object; or at block 1140, deleting an object instance of the data object, where an object instance comprises all stored metadata-consensus information and corresponding erasure coded fragments of the data object of a version of the data object. Deleting the specific version instance is based on: executing a write operation to create a delete record for the specific version instance in the local metadata-consensus information store and the one or more remote metadata-consensus information stores, where the delete record supports deleting metadata-consensus information for the specific version instance, and where the delete record operates as an indicator for the erasure coded fragments of the specific version instance to be permanently deleted using a garbage collection operation.

At block 1140, deleting an object instance of the data object, where an object instance includes all stored metadata-consensus information and corresponding erasure coded fragments of the data object of a version of the data object. Deleting the object instance is based on: executing a tombstone marker write operation, wherein the tombstone marker write operation commits a tombstone marker version as a newest version operating as an indicator to delete the object instance; deleting the erasure coded fragments corresponding to the object instance; and deleting table rows of the metadata-consensus information corresponding to the object instance. In particular, deleting the table rows of the metadata-consensus information is based on a two-phase commit deletion operation comprising: marking the table rows of the metadata-consensus information to designate the table rows for deletion, such that, write and read operations for the object instance are temporarily disabled; and removing the table rows of the metadata-consensus information.

Figure 12:
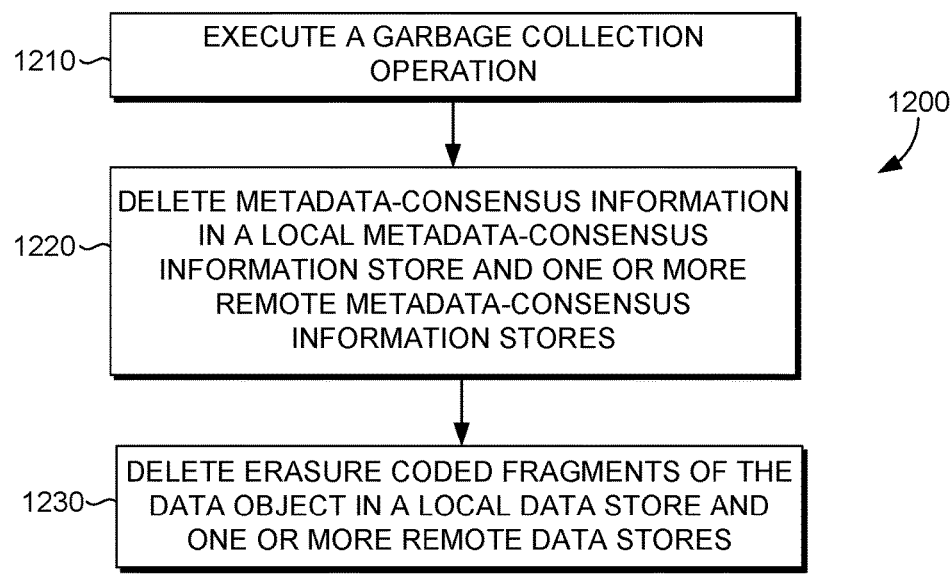
FIG. 12 is a flow diagram showing an exemplary method for implementing a distributed data object management system, in accordance with embodiments described herein.

With reference to FIG. 12, a flow diagram is provided that illustrates a method 1200 for executing a garbage operation for implementing distributed data object management. Garbage collection can be performed for a specific version instance or an object instance comprising a plurality of version instances. Initially at block 1210, a garbage collection operation is executed in a distributed storage system, the garbage collection operation includes deleting triplet version column instances and deleting corresponding erasure coded fragments.

At block 1220, metadata-consensus information is deleted in a local metadata-consensus information store and one or more remote metadata-consensus information stores, and at block 1230, erasure coded fragments of the data object is deleted in a local data store and one or more remote data stores, where a data store stores the erasure coded fragments of the data object, the local data store and the one or more remote data stores store the erasure coded fragments of the data object that correspond to the metadata-consensus information in the local metadata-consensus information store and the one or more remote metadata-consensus information stores.

Deleting the metadata-consensus information and deleting the erasure coded fragments is based on: identifying, from corresponding table stores of the metadata-consensus information in the local metadata-consensus information store and the one or more remote metadata-consensus information stores, a metadata table row corresponding to a version instance of the metadata-consensus information to be deleted; sending deletion requests to the local data store and the one or more remote data stores, to delete the corresponding erasure coded fragments; and removing corresponding triplet version column instances of the version instance from local metadata-consensus information store and the one or more remote metadata-consensus information stores.

Figure 13:
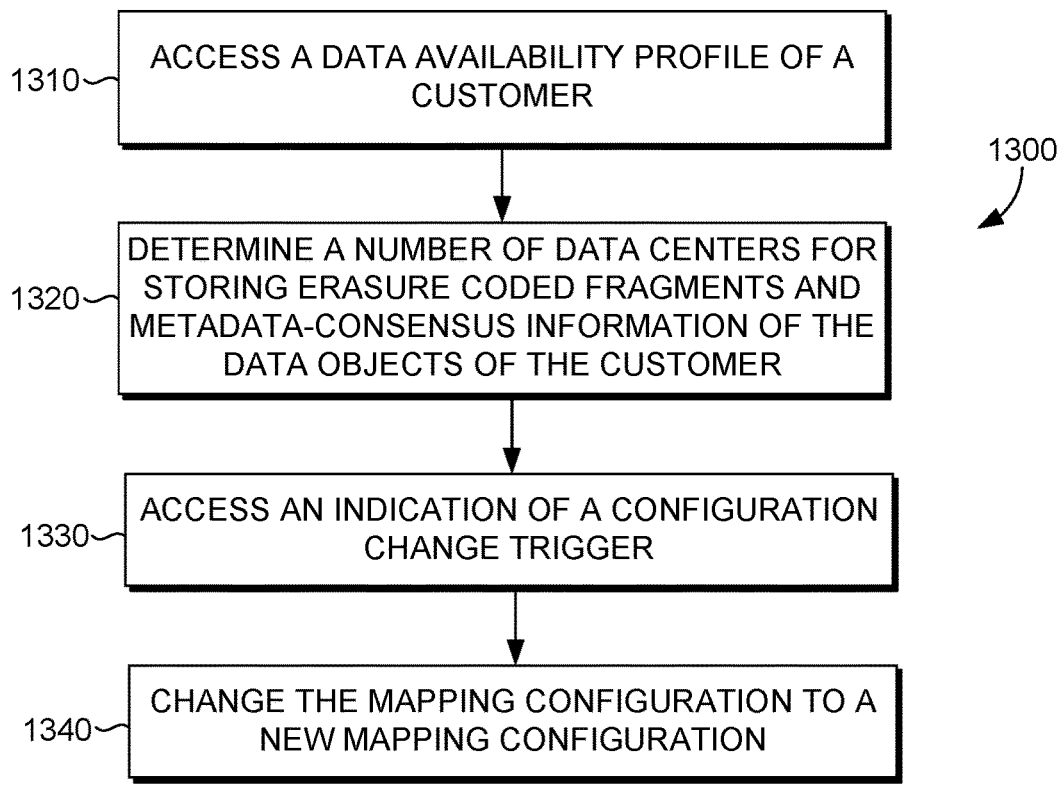
FIG. 13 is a flow diagram showing an exemplary method for implementing a distributed data object management system, in accordance with embodiments described herein.

Turning to FIG. 13, a flow diagram is provided that illustrates a method 1300 for changing a data center configuration for implementing distributed data object management. Initially at block 1310, a data availability profile of a customer is accessed. The data availability profile identifies availability parameters selected for managing availability of data objects of the customer. At block 1320, based on the data availability profile, a number of data centers for storing erasure coded fragments and metadata-consensus information of the data objects of the customer is determined for a mapping configuration. The mapping configuration for the erasure coded fragments and metadata-consensus information indicates a mapping for storing the erasure coded fragments and metadata-consensus information in the data centers. At block 1330, an indication of a configuration change trigger to change the mapping configuration is accessed. At block 1340, based on accessing the indication of the configuration change trigger, changing the mapping configuration to a new mapping configuration, the new mapping configuration is generated based at least in part on a grace period where the mapping configuration previously being used is invalidated.

Figure 14:
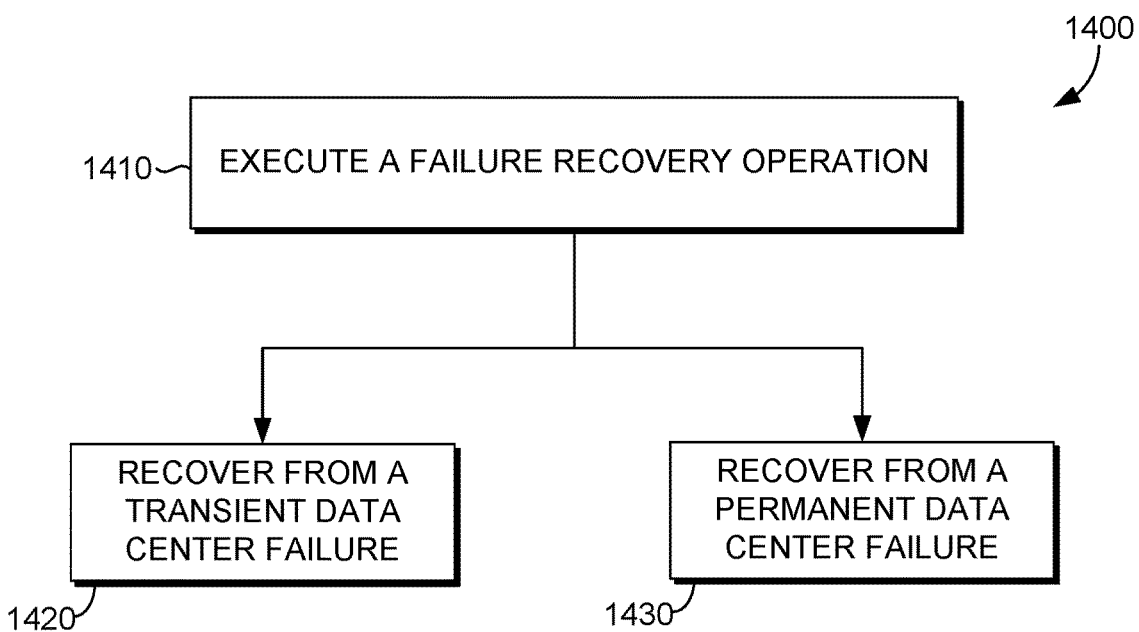
FIG. 14 is a flow diagram showing an exemplary method for implementing a distributed data object management system, in accordance with embodiments described herein.

Turning to FIG. 14, a flow diagram is provided that illustrates a method 1400 for executing failure recovery operations for implementing distributed data object management. Initially at block 1410, a failure recovery operation is executed in a distributed storage system, the failure recovery operation including one of the following operations at block 1420, block and 1430, described in more detail below. At block 1420, the failure recovery operation includes recovering from a transient data center failure based on: receiving an indication of a transient data center failure for a given data center, where table stores and object stores of the given data center are temporarily not accessible; initiating processing of write operations and read operations based on degraded write operations and degraded read operations, respectively, where a degraded write operation comprises at least two cross-data-center roundtrips; and where a degraded read operation comprises reading at least a parity fragment of the erasure coded fragments of the data object.

The failure recovery operation also includes: receiving an indication that the given data center has recovered from the transient data center failure; and triggering an update of table stores and object stores of the given data center based on: reading the erasure coded fragments of the data object from other object stores not at the given data center; recalculating an erasure coded fragment of the data object that belongs to the object store at the given data center; and writing the erasure coded fragment of the data object to the object store.

At block 1430, the failure recovery operation includes: receiving an indication of a permanent data center failure for a given data center, wherein table stores and object stores for the given data center are permanently not accessible; triggering a data center configuration change to replace the given data center; and causing regeneration of lost erasure coded fragments of the data object.

Figure 15:
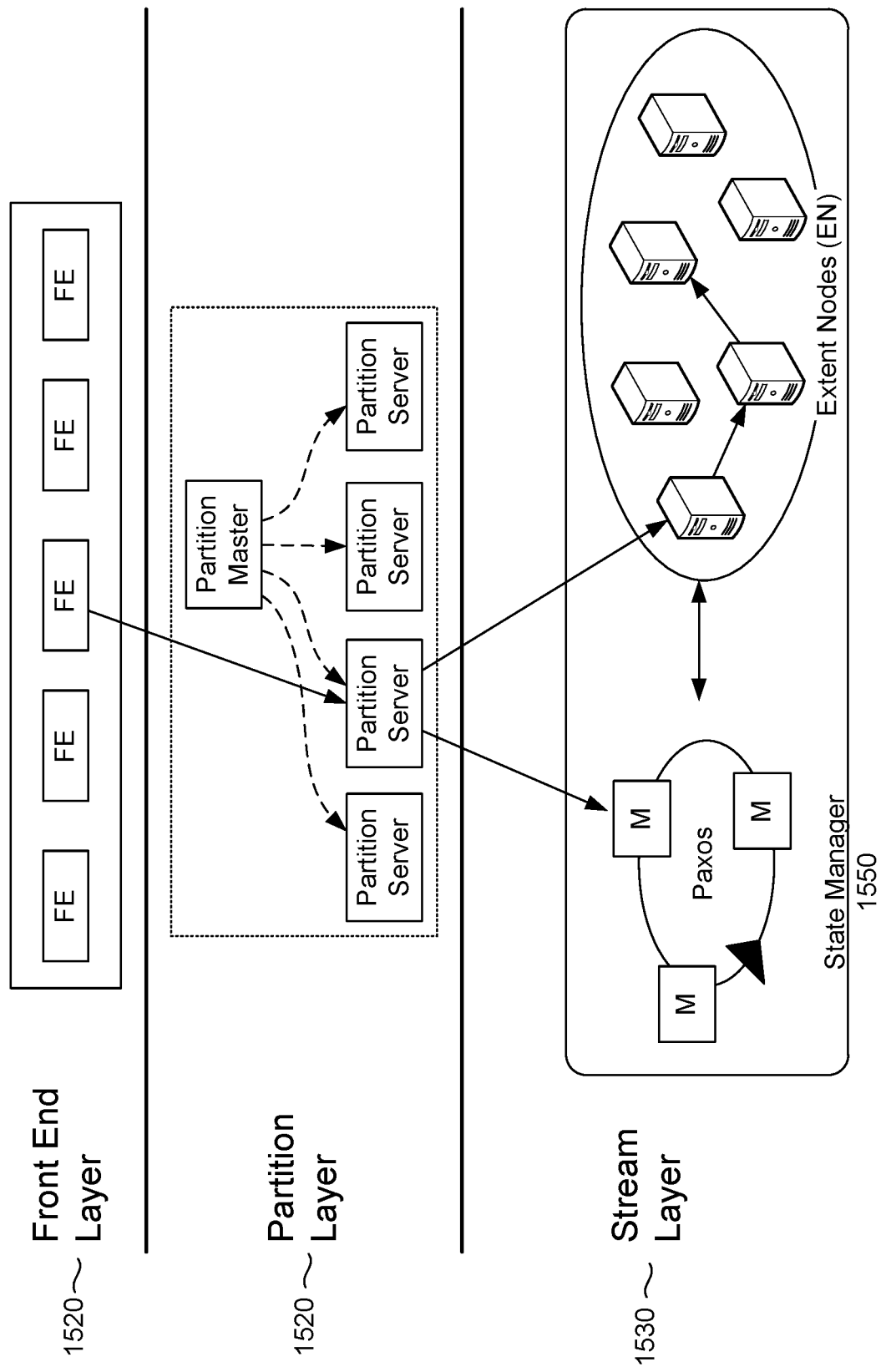
FIG. 15 is a block diagram of a distributed storage system in which embodiments described herein may be employed.

With reference to FIG. 15, by way of background, a distributed storage system 1500 can include components that support the operation of the distributed data object management system and the distributed storage system. In particular, a front-end layer 110, a partition layer 120, and a stream layer 150, can be components of the legacy distributed storage system 1500. A detailed discussion of a suitable architecture of the distributed storage system for performing embodiments described herein is further described in U.S. application Ser. No. 14/569,582, filed Dec. 12, 2014, and entitled "MULTIPLE TRANSACTION LOGS IN A DISTRIBUTED STORAGE SYSTEM," which is incorporated herein, by reference, in its entirety.

In discussions below, the partition layer 1520, and the stream layer 1530 are referred to as system partition layer and system stream layer, as discussed in more detail below. The system stream layer 1530 operates as a distributed file system which manages files called streams and blocks called extents. Streams are ordered lists of extents and extents are large storage chunks. The system stream layer 1530 stores data and ensures data durability through replication or erasure coding. The system partition layer 1520 operates to store data on top of the stream layer and manages high level abstractions, such as, Blobs, Tables, Queues, and Disks. The legacy distributed storage system 1500 can provide a namespace and stores data by partitioning all of the data objects within a storage cluster. The front-end layer 1510 can consist of a set of stateless server that take incoming requests.

In operation, the metadata of streams and extents in the system stream layer 1530 are maintained by a small cluster of nodes, called a state manager 1550 running on a consensus protocol (e.g., Paxos consensus protocol). Stream and extent metadata are hosted in-memory, thus scaling the legacy distributed storage system 1500 includes increasing memory capacity for handling the metadata. In addition, scaling would have to account for handling metadata updates which would include reaching a consensus on the execution order of the updates through the consensus protocol and executing the updates and applying changes to in-memory data structures consistently (via state manager 1550). The data path in the distributed storage system is based on chain replication and the metadata path in the legacy distributed storage system is to create the streams and the extents, where the metadata of the streams and extents are managed in combination. As such, the distributed storage system's 1500 management of metadata presents problems with regard to memory capacity and processing capability when scaling to accommodate the increased workload. The system stream layers, partition layers, and front-end layers in the legacy distributed storage system 1500 do not efficiently take advantage of the modern design and architecture of distributed storage systems having new data storage devices.

With reference to the distributed data object management system, embodiments described herein support supports storing and retrieving data objects across global data centers to maximize utilization of computing resources in a distributed computing system. In particular, the distributed data object management system implements a strongly consistent, versioned object store that encodes objects across global data centers. The distributed data object management system components refer to integrated components for distributed data object management. The integrated components refer to the hardware architecture and software framework that support distributed data object management functionality using the distributed data object management system. The hardware architecture refers to physical components and interrelationships thereof and the software framework refers to software providing functionality that can be implemented with hardware embodied on a device. The end-to-end software-based distributed data object management system can operate within the distributed data object management system components to operate computer hardware to provide distributed data object management system functionality. As such, the distributed data object management system components can manage resources and provide services for the distributed data object management system functionality. Any other variations and combinations thereof are contemplated with embodiments of the present invention.

By way of example, the distributed data object management system can include an API library that includes specifications for routines, data structures, object classes, and variables may support the interaction between the hardware architecture of the device and the software framework of the distributed data object management system. These APIs include configuration specifications for the distributed data object management system such that the different components therein can communicate with each other in the distributed data object management system, as described herein.

Figure 16:
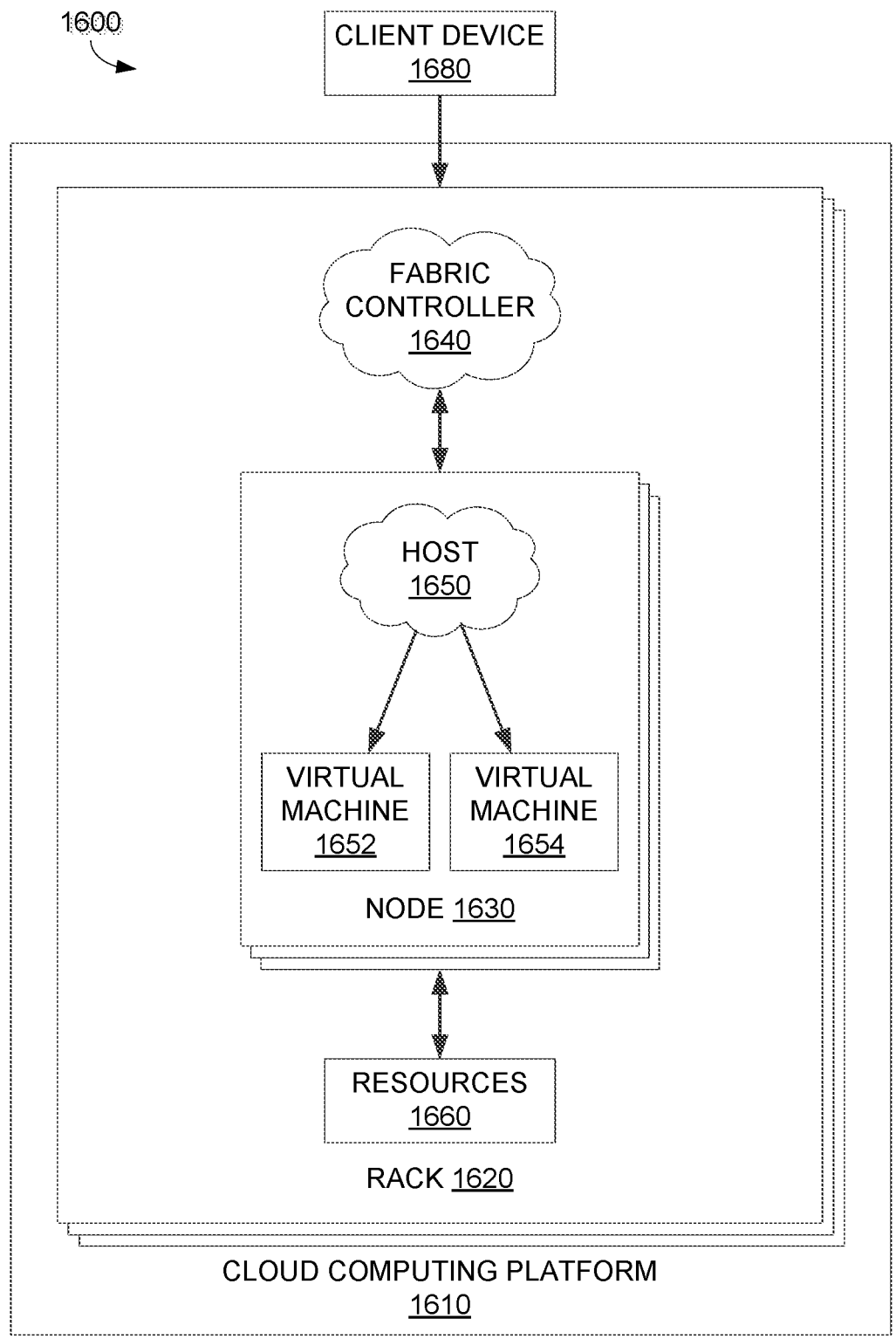
FIG. 16 is a block diagram of an exemplary distributed computing system environment suitable for use in implementing embodiments described herein.

Referring now to FIG. 16, FIG. 16 illustrates an exemplary distributed computing environment 1600 in which implementations of the present disclosure may be employed. In particular, FIG. 16 shows a high level architecture of the distributed data object management system ("system") in a cloud computing platform 1610, where the system supports seamless modification of software component. It should be understood that this and other arrangements described herein are set forth only as examples. Other arrangements and elements (e.g., machines, interfaces, functions, orders, and groupings of functions, etc.) can be used in addition to or instead of those shown, and some elements may be omitted altogether. Further, many of the elements described herein are functional entities that may be implemented as discrete or distributed components or in conjunction with other components, and in any suitable combination and location. Various functions described herein as being performed by one or more entities may be carried out by hardware, firmware, and/or software. For instance, various functions may be carried out by a processor executing instructions stored in memory.

Data centers can support the distributed computing environment 1600 that includes the cloud computing platform 1610, rack 1620, and node 1630 (e.g., computing devices, processing units, or blades) in rack 1620. The system can be implemented with a cloud computing platform 1610 that runs cloud services across different data centers and geographic regions. The cloud computing platform 1610 can implement a fabric controller 1640 component for provisioning and managing resource allocation, deployment, upgrade, and management of cloud services. Typically, the cloud computing platform 1610 acts to store data or run service applications in a distributed manner. The cloud computing infrastructure 1610 in a data center can be configured to host and support operation of endpoints of a particular service application. The cloud computing infrastructure 1610 may be a public cloud, a private cloud, or a dedicated cloud.

The node 1630 can be provisioned with a host 1650 (e.g., operating system or runtime environment) running a defined software stack on the node 1630. Node 1630 can also be configured to perform specialized functionality (e.g., compute nodes or storage nodes) within the cloud computing platform 1610. The node 1630 is allocated to run one or more portions of a service application of a tenant. A tenant can refer to a customer utilizing resources of the cloud computing platform 1610. Service application components of the cloud computing platform 1610 that support a particular tenant can be referred to as a tenant infrastructure or tenancy. The terms service application, application, or service are used interchangeably herein and broadly refer to any software, or portions of software, that run on top of, or access storage and compute device locations within, a datacenter.

When more than one separate service application is being supported by the nodes 1630, the nodes may be partitioned into virtual machines (e.g., virtual machine 1652 and virtual machine 1654). Physical machines can also concurrently run separate service applications. The virtual machines or physical machines can be configured as individualized computing environments that are supported by resources 1660 (e.g., hardware resources and software resources) in the cloud computing platform 1610. It is contemplated that resources can be configured for specific service applications. Further, each service application may be divided into functional portions such that each functional portion is able to run on a separate virtual machine. In the cloud computing platform 1610, multiple servers may be used to run service applications and perform data storage operations in a cluster. In particular, the servers may perform data operations independently but exposed as a single device referred to as a cluster. Each server in the cluster can be implemented as a node.

Client device 1680 may be linked to a service application in the cloud computing platform 1610. The client device 1680 may be any type of computing device, which may correspond to computing device 1600 described with reference to FIG. 17, for example. The client device 1380 can be configured to issue commands to cloud computing platform 1310. In embodiments, client device 1380 may communicate with service applications through a virtual Internet Protocol (IP) and load balancer or other means that directs communication requests to designated endpoints in the cloud computing platform 1310. The components of cloud computing platform 1310 may communicate with each other over a network (not shown), which may include, without limitation, one or more local area networks (LANs) and/or wide area networks (WANs).

Having described various aspects of the distributed computing environment 1600 and cloud computing platform 1610, it is noted that any number of components may be employed to achieve the desired functionality within the scope of the present disclosure. Although the various components of FIG. 16 are shown with lines for the sake of clarity, in reality, delineating various components is not so clear, and metaphorically, the lines may more accurately be grey or fuzzy. Further, although some components of FIG. 13 are depicted as single components, the depictions are exemplary in nature and in number and are not to be construed as limiting for all implementations of the present disclosure.

Figure 17:
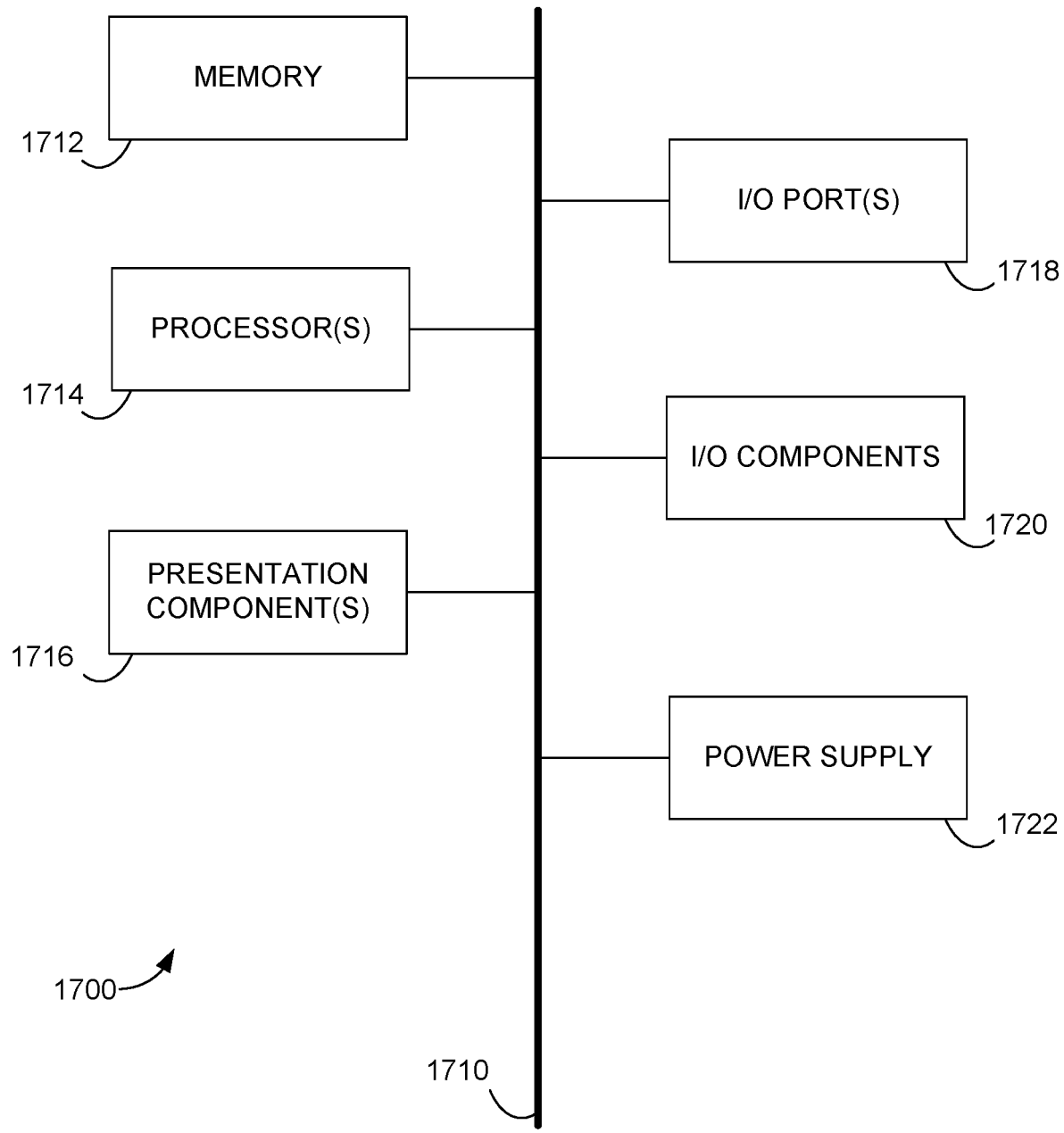
FIG. 17 is a block diagram of an exemplary computing environment suitable for use in implementing embodiments described herein.

Having briefly described an overview of embodiments of the present invention, an exemplary operating environment in which embodiments of the present invention may be implemented is described below in order to provide a general context for various aspects of the present invention. Referring initially to FIG. 17 in particular, an exemplary operating environment for implementing embodiments of the present invention is shown and designated generally as computing device 1700. Computing device 1700 is but one example of a suitable computing environment and is not intended to suggest any limitation as to the scope of use or functionality of the invention. Neither should the computing device 1700 be interpreted as having any dependency or requirement relating to any one or combination of components illustrated.

The invention may be described in the general context of computer code or machine-useable instructions, including computer-executable instructions such as program modules, being executed by a computer or other machine, such as a personal data assistant or other handheld device. Generally, program modules including routines, programs, objects, components, data structures, etc. refer to code that perform particular tasks or implement particular abstract data types. The invention may be practiced in a variety of system configurations, including hand-held devices, consumer electronics, general-purpose computers, more specialty computing devices, etc. The invention may also be practiced in distributed computing environments where tasks are performed by remote-processing devices that are linked through a communications network.

With reference to FIG. 17, computing device 1700 includes a bus 1710 that directly or indirectly couples the following devices: memory 1712, one or more processors 1714, one or more presentation components 1716, input/output ports 1718, input/output components 1720, and an illustrative power supply 1722. Bus 1710 represents what may be one or more busses (such as an address bus, data bus, or combination thereof). Although the various blocks of FIG. 17 are shown with lines for the sake of clarity, in reality, delineating various components is not so clear, and metaphorically, the lines would more accurately be grey and fuzzy. For example, one may consider a presentation component such as a display device to be an I/O component. Also, processors have memory. We recognize that such is the nature of the art, and reiterate that the diagram of FIG. 17 is merely illustrative of an exemplary computing device that can be used in connection with one or more embodiments of the present invention. Distinction is not made between such categories as "workstation," "server," "laptop," "hand-held device," etc., as all are contemplated within the scope of FIG. 17 and reference to "computing device."

Computing device 1700 typically includes a variety of computer-readable media. Computer-readable media can be any available media that can be accessed by computing device 1700 and includes both volatile and nonvolatile media, removable and non-removable media. By way of example, and not limitation, computer-readable media may comprise computer storage media and communication media.

Computer storage media include volatile and nonvolatile, removable and non-removable media implemented in any method or technology for storage of information such as computer-readable instructions, data structures, program modules or other data. Computer storage media includes, but is not limited to, RAM, ROM, EEPROM, flash memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by computing device 1700. Computer storage media excludes signals per se.

Communication media typically embodies computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, RF, infrared and other wireless media. Combinations of any of the above should also be included within the scope of computer-readable media.

Memory 1712 includes computer storage media in the form of volatile and/or nonvolatile memory. The memory may be removable, non-removable, or a combination thereof. Exemplary hardware devices include solid-state memory, hard drives, optical-disc drives, etc. Computing device 1700 includes one or more processors that read data from various entities such as memory 1712 or I/O components 1720. Presentation component(s) 1716 present data indications to a user or other device. Exemplary presentation components include a display device, speaker, printing component, vibrating component, etc.

I/O ports 1718 allow computing device 1700 to be logically coupled to other devices including I/O components 1720, some of which may be built in. Illustrative components include a microphone, joystick, game pad, satellite dish, scanner, printer, wireless device, etc.

Embodiments described in the paragraphs below may be combined with one or more of the specifically described alternatives. In particular, an embodiment that is claimed may contain a reference, in the alternative, to more than one other embodiment. The embodiment that is claimed may specify a further limitation of the subject matter claimed.

The subject matter of embodiments of the invention is described with specificity herein to meet statutory requirements. However, the description itself is not intended to limit the scope of this patent. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

For purposes of this disclosure, the word "including" has the same broad meaning as the word "comprising," and the word "accessing" comprises "receiving," "referencing," or "retrieving." Further the word "communicating" has the same broad meaning as the word "receiving," or "transmitting" facilitated by software or hardware-based buses, receivers, or transmitters" using communication media described herein. Also, the word "initiating" has the same broad meaning as the word "executing or "instructing" where the corresponding action can be performed to completion or interrupted based on an occurrence of another action. In addition, words such as "a" and "an," unless otherwise indicated to the contrary, include the plural as well as the singular. Thus, for example, the constraint of "a feature" is satisfied where one or more features are present. Also, the term "or" includes the conjunctive, the disjunctive, and both (a or b thus includes either a or b, as well as a and b).

For purposes of a detailed discussion above, embodiments of the present invention are described with reference to a distributed computing environment; however the distributed computing environment depicted herein is merely exemplary. Components can be configured for performing novel aspects of embodiments, where the term "configured for" can refer to "programmed to" perform particular tasks or implement particular abstract data types using code. Further, while embodiments of the present invention may generally refer to the distributed data object management system and the schematics described herein, it is understood that the techniques described may be extended to other implementation contexts.

Embodiments of the present invention have been described in relation to particular embodiments which are intended in all respects to be illustrative rather than restrictive. Alternative embodiments will become apparent to those of ordinary skill in the art to which the present invention pertains without departing from its scope.

From the foregoing, it will be seen that this invention is one well adapted to attain all the ends and objects hereinabove set forth together with other advantages which are obvious and which are inherent to the structure.

It will be understood that certain features and sub-combinations are of utility and may be employed without reference to other features or sub-combinations. This is contemplated by and is within the scope of the claims.

The invention claimed is:

1. A system for implementing distributed data object management, the system comprising:
   one or more computer processors; and
   computer memory storing computer-usable instructions that, when used by the one or more computer processors, cause the one or more computers processors to perform, in a distributed data object management system, operations comprising:
   applying a consensus protocol that comprises instructions for consensus operations, wherein the instructions are based on a fast path protocol and a slow path protocol of the consensus protocol, the instructions include each of the following:
   write common-case consensus operations of the fast path protocol;
   read common-case consensus operations of the fast path protocol;
   write contention-case consensus operations of the slow path protocol associated with failed write common-case consensus operations of the fast path protocol;
   read contention-case consensus operations of the slow path protocol associated with failed read common-case consensus operations of the fast path protocol;
   determining whether a write operation or a read operation is for a common case or a contention-case;
   based on a consensus protocol and the common-case or the contention-case, executing the write operation and the read operation,
   wherein the consensus operations of the consensus protocol are executed using a metadata write path and a data write path, a metadata read path and the data read path;
   the metadata write path and the data write path, and the metadata read path and the data read path each in combination are used in parallel based on the instructions in the consensus protocol to respectively write and read to each of the following:
   local metadata-consensus information stores, remote metadata-consensus information stores, local data stores, and remote data stores, for executing the write operation and the read operation,
   wherein the write operation is executed based on a metadata write path and a data write path, wherein writing using the metadata write path and the data write path is performed in parallel, and
   wherein the read operation is executed based on a metadata read path and a data read path, wherein reading using the metadata read path and the data read path is performed in parallel.

2. The system of claim 1, wherein the distributed data object management system is developed based on a distributed storage system comprising:
   a local metadata-consensus information store and one or more remote metadata-consensus information stores,
   wherein a metadata-consensus information store is a table store for metadata-consensus information, the metadata-consensus information corresponds to erasure coded fragments of the data object; and
   a local data store and one or more remote data stores, wherein a data store is an object store that stores the erasure coded fragments of the data object, the local data store and the one or more remote data stores store the erasure coded fragments of the data object that correspond to metadata-consensus information in the local metadata-consensus information store and the one or more remote metadata-consensus information stores.

3. The system of claim 2, wherein executing the write operation comprises:
   writing, to the local metadata-consensus information store and the one or more remote metadata-consensus information stores using the metadata write path, metadata-consensus information of erasure coded fragments of a data object,
   wherein the metadata-consensus information corresponds to erasure coded fragments of the data object; and
   writing, to a local data store and one or more remote data stores, wherein metadata-consensus information for an erasure coded fragment comprises a known committed version identifier, wherein the known committed version identifier is accessible for executing the write operation based on the consensus protocol; and
   wherein executing the read operation comprises:
   reading, from the local metadata-consensus information store and the one or more remote metadata-consensus information stores, using the metadata read path, metadata-consensus information of the erasure coded fragments of the data object, and reading, from the local data store or the one or more remote data stores, using the data read path, the erasure coded fragments of the data object.

4. The system of claim 1, wherein executing the write operation for the common-case comprises:
  determining a next version number to execute the write operation using the consensus protocol, wherein the next version number is determined based on a known committed version number at the local metadata-consensus information store; and
  initiating a fast-round write using the fast-path protocol of the consensus protocol to update a local metadata store and one or more remote metadata-consensus information stores,
  wherein the fast-path protocol comprises a pre-accept request of the fast-round write for updating the local metadata store and the one or more remote metadata-consensus information store.

5. The system of claim 1, wherein executing the write operation for the contention-case comprises:
  determining a next version number to execute the write operation using the consensus protocol, wherein the next version number is determined based on a known committed version number at a local metadata-consensus information store;
  initiating a fast-round write using the fast-path protocol of the consensus protocol to update the local metadata store and one or more remote metadata-consensus information store,
  wherein the fast-path protocol comprises a pre-accept request of the fast-round write for updating the local metadata store and the one or more remote metadata-consensus information stores;
  determining that the fast-round write failed based on the pre-accept request not receiving quorum of acceptances for the fast-round write; and
  initiating a classic-round write using the slow-path protocol of the consensus protocol to update the local metadata-consensus information store and the one or more remote metadata-consensus information store,
  wherein the slow-path protocol comprises both a prepare request and an accept request of the classic-round write for updating the local metadata store and the one or more remote metadata-consensus information stores.

6. The system of claim 1, wherein executing the read operation for the common-case comprises:
  initiating a fast-round read using the fast-path protocol of the consensus protocol, wherein the fast-path protocol comprises reading from each of the local metadata stores and one or more remote metadata-consensus information stores; and
  returning a matching known committed version, wherein the matching known committed version is matched and stored at a majority of the local metadata stores and the one or more remote metadata-consensus information stores; and
    wherein a next version number has not been accepted at any of a local metadata store or the one or more remote metadata-consensus information stores.

7. The system of claim 1, wherein executing the read operation for the contention-case comprises:
  initiating a fast-round read using the fast-path protocol of the consensus protocol, wherein the fast-path protocol comprises reading from each of the local metadata stores and one or more remote metadata-consensus information stores;

determining that a next version number has been accepted at least one of the local metadata store and the one or more remote metadata-consensus information stores; and
  initiating a classic-round read using the slow-path protocol of the consensus protocol, wherein the slow-path protocol comprises determining whether the next version number is a correct version number for each of the local metadata store and the one or more remote metadata-consensus information stores.

8. The system of claim 1, wherein writing using the metadata write path and the data write path performed in parallel further comprises:
  determining that writing using the data write path was successful while writing using the metadata write path was unsuccessful; and
  initiating a failure-based deletion operation, wherein the failure-based deletion operation operates to delete erasure coded fragments associated with the successful data write path.

9. The system of claim 1, wherein reading using the metadata read path and the data read path performed in parallel further comprises:
  determining that writing using the data write path was unsuccessful while writing using the metadata write path was successful; and
  initiating a next read operation to read a previous version number prior to a version number associated with the successful metadata write path.

10. The system of claim 1, wherein writing and reading using the metadata write path, data write path, metadata read path and the data read path performed in parallel comprises:
  excluding sequential writing and reading where data path writes and reads are executed to completion first before starting on the corresponding metadata path writes and reads or conversely metadata path writes and reads are executed to completion first before starting on the corresponding data path writes and reads.

11. The system of claim 1, wherein the metadata-consensus information comprises one or more of the following:
  a known committed version, wherein the known committed version operates as a hint element in write operations and read operations;
  a pointer to the corresponding erasure coded fragments of the data object;
  one or more triplets of version column instances, a triplet of version columns comprising:
    a highest ballot number seen;
    a highest accepted ballot number; and
    a highest accepted value.

12. A computer-implemented method for distributed data object management in a distributed data object management system, the method comprising:
  executing a write operation, in a common-case or contention-case, based on a metadata write path and a data write path, wherein writing using the metadata write path and the data write path is performed in parallel, and wherein the write operation comprises:
  applying a consensus protocol that comprises instructions for consensus operations, wherein the instructions are based on a fast path protocol and a slow path protocol of the consensus protocol, the instructions include each of the following:
    write common-case consensus operations of the fast path protocol;

write contention-case consensus operations of the slow path protocol associated with failed write common-case consensus operations of the fast path protocol;

based on the consensus protocol and the common-case or the contention-case, writing, to a local metadata-consensus information store and one or more remote metadata-consensus information stores, using the metadata write path, metadata-consensus information of erasure coded fragments of a data object, the metadata-consensus information corresponds to erasure coded fragments of a data object; and writing, to a local data store and one or more remote data stores, using the data write path, the erasure coded fragments of the data object.

13. The method of claim 12, wherein executing the write operation for the common-case comprises:

determining a next version number to execute the write operation using the consensus protocol, wherein the next version number is determined based on a known committed version number at the local metadata-consensus information store; and initiating a fast-round write using the fast-path protocol of the consensus protocol to update the local metadata store and the one or more remote metadata-consensus information store, wherein the fast-path protocol comprises a pre-accept request of the fast-round write for updating the local metadata store and the one or more remote metadata-consensus information store.

14. The method of claim 12, wherein executing the write operation for the contention-case comprises:

determining a next version number to execute the write operation using the consensus protocol, wherein the next version number is determined based on the known committed version number at the local metadata-consensus information store;

initiating a fast-round write using the fast-path protocol of the consensus protocol to update the local metadata store and the one or more remote metadata-consensus information store, wherein the fast-path protocol comprises a pre-accept request of the fast-round write for updating the local metadata store and the one or more remote metadata-consensus information stores;

determining that the fast-round write failed based on the pre-accept request not receiving quorum of acceptances for the fast-round write; and initiating a classic-round write using the slow-path protocol of the consensus protocol to update the local metadata-consensus information store and the one or more remote metadata-consensus information store, wherein the slow-path protocol comprises both a prepare request and an accept request of the classic-round write for updating the local metadata store and the one or more remote metadata-consensus information stores.

15. The method of claim 12, wherein writing using the metadata write path and the data write path performed in parallel further comprises:

determining that writing using the data write path was successful while writing using the metadata write path was unsuccessful; and initiating a failure-based deletion operation, wherein the failure-based deletion operation operates to delete erasure coded fragments associated with the successful data write path.

16. The method of claim 12, wherein executing the write operation does not overwrite existing metadata-consensus information or erasure coded fragments of the data object, the write operation operates to create new versions of the metadata-consensus information or erasure coded fragments of the data fragments associated with old versions that remain available until explicitly deleted.

17. A computer-implemented method for distributed data object management, the method comprising:

executing a read operation, for a common-case or a contention-case, based on a metadata read path and a data read path, wherein reading using the metadata read path and the data read path is performed in parallel, and wherein the read operation comprises:

applying a consensus protocol that comprises instructions for consensus operations, wherein the instructions are based on a fast path protocol and a slow path protocol of the consensus protocol, the instructions include each of the following:

read common-case consensus operations of the fast path protocol;

read contention-case consensus operations of the slow path protocol associated with failed read common-case consensus operations of the fast path protocol;

based on the consensus protocol and the common-case or the contention-case, reading, from a local metadata-consensus information store and one or more remote metadata-consensus information stores, using the metadata read path, metadata-consensus information of the erasure coded fragments of a data object, wherein metadata-consensus information for an erasure coded fragment comprises a known committed version identifier; and reading, from the local data store and one or more remote data stores, using the data read path, the erasure coded fragments of the data object.

18. The method of claim 17, wherein executing the read operation for the common-case comprises:

initiating a fast-round read using the fast-path protocol of the consensus protocol, wherein the fast-path protocol comprises reading from each of the local metadata store and the one or more remote metadata-consensus information store; and returning a matching known committed version, wherein the matching known committed version is matched and stored at a majority of the local metadata store and the one or more remote metadata-consensus information stores; and wherein a next version number has not been accepted at any of the local metadata store or the one or more remote metadata-consensus information stores.

19. The method of claim 17, wherein executing the read operation for contention-case comprises:

initiating a fast-round read using the fast-path protocol of the consensus protocol, wherein the fast-path protocol comprises reading from each of the local metadata store and the one or more remote metadata-consensus information stores;

determining that a next version number has been accepted at least one of the local metadata store and the one or more remote metadata-consensus information stores; and initiating a classic-round read using the slow-path protocol of the consensus protocol, wherein the slow-path protocol comprises determining whether the next version number is a correct version number for each of the local metadata store and the one or more remote metadata-consensus information stores.

20. The method of claim 17, wherein reading using the metadata read path and the data read path performed in parallel further comprises:

determining that writing using the data write path was unsuccessful while writing using the metadata write path was successful; and initiating a next read operation to read a previous version number prior to a version number associated with the successful metadata write path.

\* \* \* \* \*